(12) United States Patent
Erickson et al.

(10) Patent No.: US 9,018,713 B2
(45) Date of Patent: Apr. 28, 2015

(54) PLURAL DIFFERENTIAL PAIR EMPLOYING FINFET STRUCTURE

(75) Inventors: Karl R. Erickson, Rochester, MN (US); Phil C. Paone, Rochester, MN (US); David P. Paulsen, Dodge Center, MN (US); John E. Sheets, Zumbrota, MN (US); Gregory J. Uhlmann, Rochester, MN (US); Kelly L. Williams, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 225 days.

(21) Appl. No.: 13/532,422

(22) Filed: Jun. 25, 2012

(65) Prior Publication Data

US 2013/0341733 A1     Dec. 26, 2013

(51) Int. Cl.
*H01L 27/088*     (2006.01)
*H01L 21/8234*    (2006.01)
*H01L 27/12*      (2006.01)

(52) U.S. Cl.
CPC ..... *H01L 21/823431* (2013.01); *H01L 21/823475* (2013.01); *H01L 27/0886* (2013.01); *H01L 27/1211* (2013.01)

(58) Field of Classification Search
CPC .............. H01L 21/845; H01L 27/1211; H01L 29/66795; H01L 29/785
USPC ........................................................ 257/401
See application file for complete search history.

(56) References Cited

U.S. PATENT DOCUMENTS

| | | | |
|---|---|---|---|
| 5,516,710 A * | 5/1996 | Boyd et al. | ..... 438/309 |
| 5,804,848 A | 9/1998 | Mukai | |
| 6,188,339 B1 * | 2/2001 | Hasegawa | ..... 341/101 |
| 6,211,717 B1 | 4/2001 | Prodanov | |
| 6,611,029 B1 | 8/2003 | Ahmed et al. | |
| 7,098,502 B2 | 8/2006 | Mathew et al. | |
| 7,241,649 B2 | 7/2007 | Donze et al. | |
| 7,244,640 B2 | 7/2007 | Yang et al. | |
| 7,550,773 B2 | 6/2009 | Booth, Jr. et al. | |
| 7,671,637 B2 | 3/2010 | Morisson | |
| 7,863,122 B2 | 1/2011 | Booth, Jr. et al. | |
| 8,377,779 B1 | 2/2013 | Wang | |
| 8,389,392 B2 | 3/2013 | Sonsky et al. | |
| 8,653,630 B2 | 2/2014 | Liaw et al. | |

(Continued)

OTHER PUBLICATIONS

Hisamoto et al., "FinFET—A Self-Aligned Double-Gate MOSFET Scalable to 20 nm", IEEE Transactions on Electron Devices, Dec. 2000, vol. 47, No. 12, pp. 2320-2325, © 2000 IEEE.

(Continued)

*Primary Examiner* — Steven Loke
*Assistant Examiner* — Sitaramarao S Yechuri
(74) *Attorney, Agent, or Firm* — Scott S. Dobson; Robert Williams

(57) ABSTRACT

A plural differential pair may include a first semiconductor fin having first and second drain areas. First and second body areas may be disposed on the fin between the first and second drain areas. A source area may be disposed on the fin between the first and second body areas. The plural differential pair may include a first pair of fin field effect (FinFET) transistors and a second pair of FinFET transistors. The plural differential pair may include first and second top fin areas projecting from respective portions of a top side of the first and second body areas of the fin. The first and second top fin areas may each have a width that is wider than the first and second body areas of the fin.

6 Claims, 24 Drawing Sheets

(56) References Cited

U.S. PATENT DOCUMENTS

| | | |
|---|---|---|
| 2006/0091463 A1 | 5/2006 | Donze et al. |
| 2006/0197140 A1 | 9/2006 | Muralidhar et al. |
| 2007/0102763 A1 | 5/2007 | Yeo et al. |
| 2009/0001464 A1* | 1/2009 | Booth et al. ............ 257/347 |
| 2010/0025767 A1* | 2/2010 | Inaba ...................... 257/365 |
| 2010/0102389 A1* | 4/2010 | Muller et al. ............ 257/347 |
| 2011/0062512 A1 | 3/2011 | Shah et al. |
| 2013/0137234 A1 | 5/2013 | Baars et al. |
| 2013/0164910 A1 | 6/2013 | Anderson et al. |
| 2013/0187264 A1 | 7/2013 | Tan et al. |

OTHER PUBLICATIONS

Endo, K. et al., "Four Terminal FinFETs Fabricated Using an Etch-Back Gate Separation", IEEE Transactions on Nanotechnology, Mar. 2007, pp. 201-205, vol. 6, Issue 2.

Liu, Y. et al., "Cointegration of High Performance Tied-Gate Three Terminal FinFETs and Variable Threshold-Voltage Independent-Gate Four-Terminal FinFETs With Asymmetric Gate-Oxide Thickness", IEEE Electron Device Letters, Jun. 2007, pp. 517-519, vol. 28, Issue 6.

Mathew, L. et al., "CMOS Vertical Multiple Independent Gate Field Effect Transistor (MIGFET)", 2004 IEEE International SOI Conference, Oct. 4-7, 2004, pp. 187-189. DOI: 10.1109/SOI.2004.1391610.

Mathew, L. et al., "Multiple Independent Gate Field Effect Transistor (MIGFET)—Multi-Fin RP Mixer Architecture, Three Independent Gates (MIGFET-T) Operation and Temperature Characteristics". Digest of Technical Papers, 2005 Symposium on VLSI Technology, Jun. 14-16, 2005, pp. 200-201.

Mishra et al., "FinFET Circuit Design", Nanoelectronic Circuit Design, 2011, pp. 23-54, 1st edition, Springer, New York. DOI: 10.1007/978-1-4419-7609-3_2.

Rostami et al., "Novel dual-Vth independent-gate FinFET circuits," 2010 15th Asia and South Pacifi Design Automation Conference (ASP-DAC),pp. 867-872, Jan. 18-21, 2010 doi: 10.1109/ASPDAC. 2010.5419680 Rostami et al., "Novel dual-Vth independent-gate FinFET circuits," http://www.pitt.edu/~kmram/publications/PID1069335.pdf.

Xiong, Weize (Wade)., "Multigate MOSFET Technology", FinFETs and Other Multi-Gate Transistors, Edited by J.P. Colinge, Springer US, pp. 84-91, © 2008 Springer Science + Business Media, LLC, New York, USA.

Erickson et al., "Structure Having Three Independent FinFET Transistors", U.S. Appl. No. 13/211,445, filed Aug. 17, 2011.

Erickson et al., "FinFET with Body Contact", Filed Jun. 25, 2012.

\* cited by examiner

Cross-Section B-B'

Cross-Section C-C'

Cross-Section B-B'

Cross-Section C-C'

Cross-Section B-B'

Cross-Section C-C'

Cross-section B-B'

Cross-section C-C'

Cross-section B-B'

Cross-section C-C'

Cross-section B-B'

Cross-section C-C'

Cross-section B-B'

Cross-section C-C'

Cross-section B-B'

Cross-section C-C'

Cross-section B-B'

Cross-section C-C'

Cross-section B-B'

Cross-section C-C'

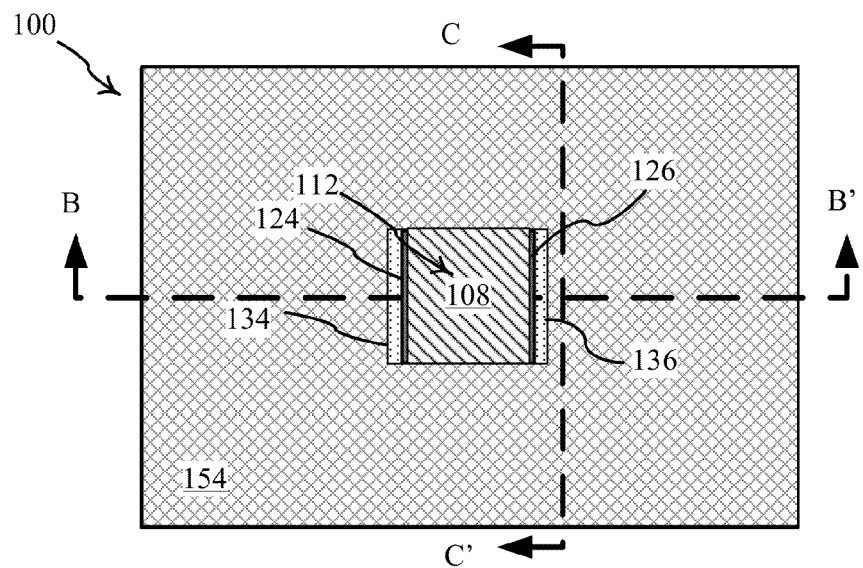
Figure 13A
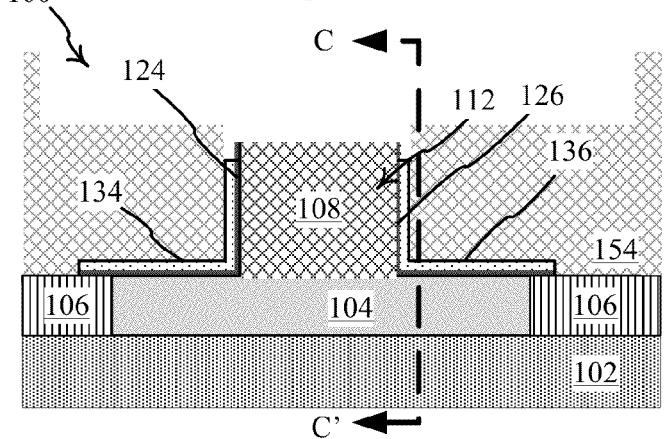
Figure 13B Cross-section B-B'
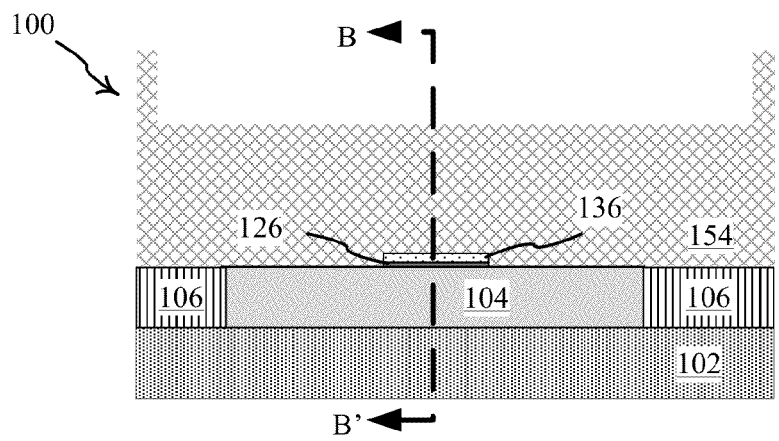
Figure 13C Cross-section C-C'

Cross-section B-B'

Cross-section C-C'

Cross-section B-B'

Cross-section C-C'

Cross-section B-B'

Cross-section C-C'

Cross-section B-B'

Cross-section C-C'

Cross-section B-B'

Cross-section C-C'

Cross-section B-B'

Cross-section C-C'

PLURAL DIFFERENTIAL PAIR EMPLOYING FINFET STRUCTURE

FIELD

This invention relates generally to semiconductor devices, and more specifically to FinFETs.

BACKGROUND

A semiconductor device is a component of most electronic systems. Field effect transistors (FETs) have been the dominant semiconductor technology used to make application specific integrated circuit (ASIC) devices, microprocessor devices, static random access memory (SRAM) devices, and the like for many years. In particular, complementary metal oxide semiconductor (CMOS) technology has dominated the semiconductor process industry for a number of years.

Technology advances have scaled FETS on semiconductor devices to small dimensions allowing power per logic gate to be dramatically reduced, and further allowing a very large number of FETs to be fabricated on a single semiconductor device. However, traditional FETS are reaching their physical limitations as their size decreases. FinFETs are a recent development. FinFETs use three dimensional techniques to pack a large number of FETs in a very small area.

SUMMARY

One embodiment is directed to a plural differential pair. The plural differential pair may include a first semiconductor fin having first and second drain areas. In addition, first and second body areas may be disposed on the fin between the first and second drain areas. Further, a source area may be disposed on the fin between the first and second body areas. The fin may have first and second sides that are substantially perpendicular to a substrate. The fin may also have a top side between the first and second sides. The top side may be substantially parallel to the substrate and located opposite a side of the fin that is in contact with the substrate. Additionally, the plural differential pair may include a first pair of fin field effect (FinFET) transistors and a second pair of FinFET transistors. The first pair of FinFET transistors may include a first FinFET having a first gate electrode adjacent to the first body area, and a second FinFET having a second gate electrode adjacent to the second body area. In addition, the second pair of FinFET transistors may include a third FinFET having a third gate electrode adjacent to the first body area, and a fourth FinFET having a fourth gate electrode adjacent to the second body area. Moreover, the plural differential pair may include first and second top fin areas projecting from respective portions of the top side of the first and second body areas of the fin. The first and second top fin areas may each have a width that is wider than the first and second body areas of the fin.

Another embodiment is directed to a method for making a plural differential pair.

BRIEF DESCRIPTION OF THE DRAWINGS

Embodiments will be better understood from the following detailed description with reference to the drawings, in which:

FIGS. 3A-19C show sequential views of an exemplary FinFET structure according to an embodiment. Figures with the same numeric label correspond to the same stage of manufacturing. Figures with the suffix "A" are top-down views. Figures with the suffix "B" or "C" are vertical cross-sectional views along the plane B-B' or C-C', respectively, of the corresponding figure with the same numeric label and the suffix "A."

DETAILED DESCRIPTION

Figure 1:
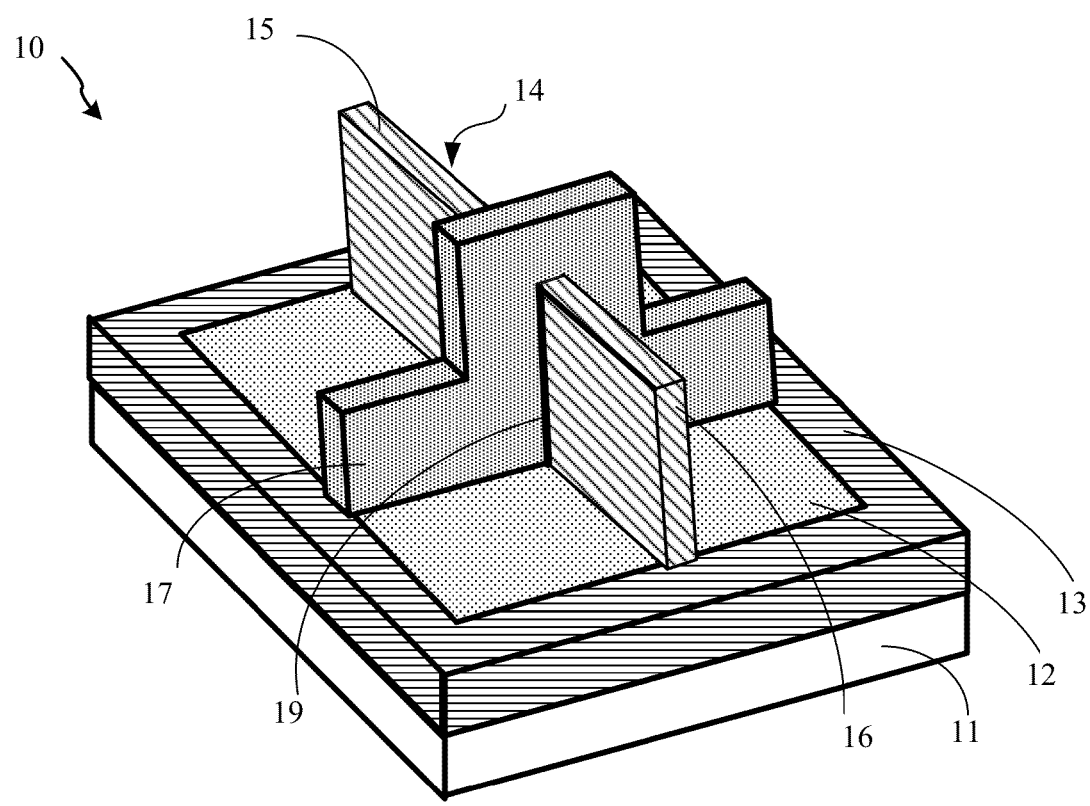
FIG. 1 is a prior art isometric drawing of a FinFET.

Features illustrated in the drawings are not necessarily drawn to scale. Descriptions of well-known components and processing techniques are omitted so as to not unnecessarily obscure the disclosed embodiments. The descriptions of embodiments are provided by way of example only, and are not intended to limit the scope of this invention as claimed. The same numbers may be used in the Figures and the Detailed Description to refer to the same devices, parts, components, steps, operations, and the like.

The making of traditional FETs is currently running into physical barriers when creating small, fast semiconductor devices. Gate oxides have become thin enough that current leakage occurs through the gate oxides. Further scaling of gate oxide thickness will bring an exponential increase in current leakage. Power dissipated by current leakage has become a significant portion of total device power, and an exponential increase in current leakage may result in unacceptable power dissipation for many types of devices.

Silicon on Insulator (SOI) processes that have been introduced have reduced FET source and drain capacitances, resulting in an improved power/performance ratio for CMOS devices fabricated in an SOI process. However, conventional SOI processes are also reaching fundamental limits, resulting in undesirable effects such as the current leakage effects mentioned above. Therefore, innovative ways to make CMOS devices are being created such as FinFETs.

A FinFET is a FET device that utilizes three dimensional techniques to pack a large number of FETs in a given area of a semiconductor device and addresses the scaling problems described above. FinFETs have at least one narrow, semiconductor fin, preferably less than 10 nm in width. This fin is gated by electrodes at one or more locations along the length of the fin. Prior art FIG. 1 shows an isometric view of a FinFET 10. A substrate 12 (typically silicon) may be on an insulative buried oxide 11. The substrate 12 may also be insulated on its sides by a recessed oxide 13. A tall, thin fin 14 of semiconductor material (also typically silicon) rises from the substrate 12. The fin 14 includes a first source/drain area 15 and second source/drain area 16. The FinFET 10 includes a gate electrode 17 that surrounds fin 14 on three of the sides of fin 14. The gate electrode 17 may be a conductor such as a polysilicon, shown in prior art FIG. 2B. A gate oxide layer 19 insulates the gate electrode 17 from silicon material in the fin 14 and substrate 12. The gate oxide layer 19 may be much thinner than the gate electrode 17. In regions where the silicon material is doped, for example P− (for an N-channel FET, an NFET), first source/drain area 15 and second source/drain area 16 are also doped to become N+ regions, with the P− region under gate electrode 17 serving as a body (not shown in FIG. 1) of the FinFET 10.

FinFETs have significant advantages. Being "three dimensional" FETs, the gate electrode 17 may induce conducting channels on three sides of the fin 14, increasing current flow through a conducting FET, and making it less necessary that the gate oxide layer 19 be as thin as the gate oxide of a conventional planar FET.

Figure 2A:
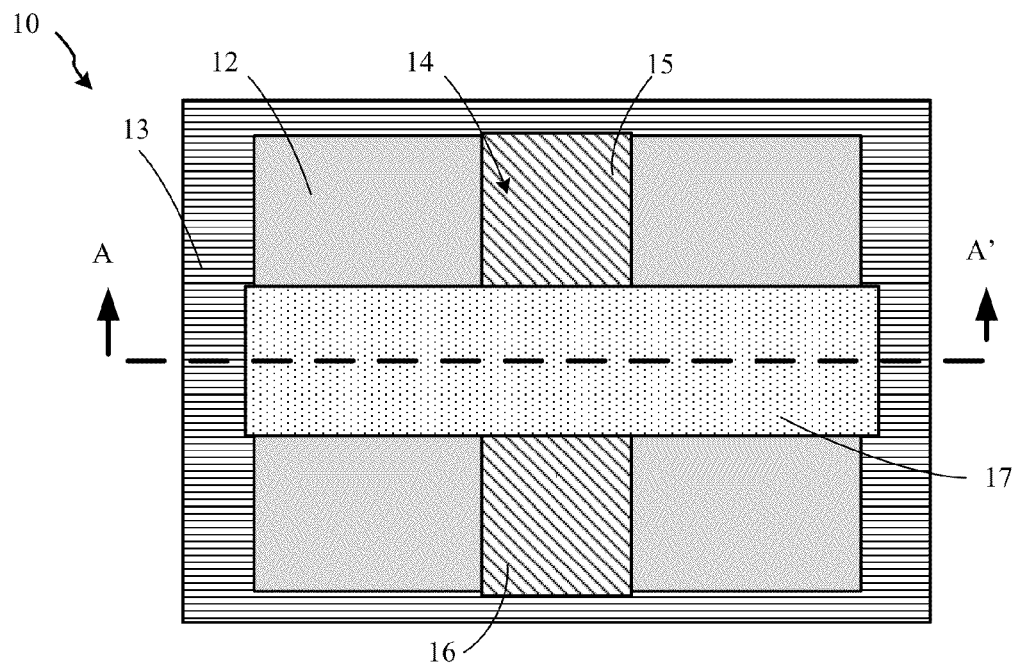
FIG. 2A is a prior art drawing showing a top view of the FinFET of FIG. 1 and identifies a cross section A-A'.
Figure 2B:
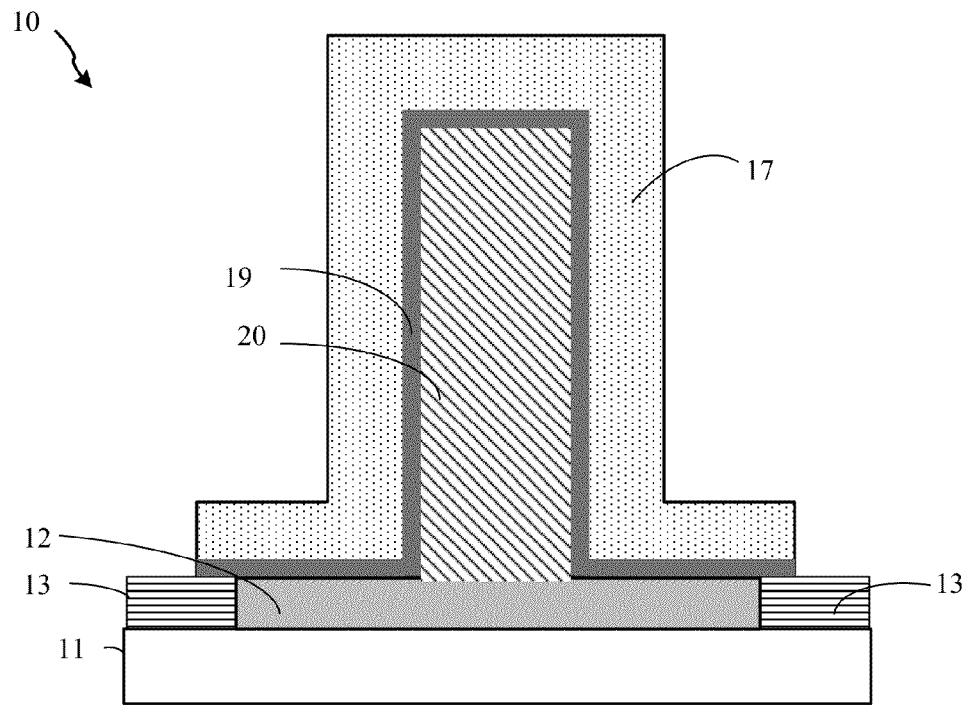
FIG. 2B is a prior art drawing showing a cross sectional view A-A' of the FinFET of FIG. 2A.

FIG. 2A is a prior art drawing showing a top view (i.e., looking "down" toward substrate 12) of a FinFET 10. First source/drain area 15 and second source/drain area 16 are doped N+ (for an NFET). To better illustrate the makeup of the FinFET 10, a cross sectional view at A-A' is shown in FIG. 2B. A body 20 is the portion of fin 14 that is the body of the FinFET 10, and is doped P− for an NFET. (A P-channel FET (PFET) would begin with an N− doped fin, the first source/drain area 15 and second source/drain regions 16 of the PFET subsequently doped P+.) The gate oxide layer 19 is shown covering both sides and the top of body 20 as well as the top of substrate 12. Gate electrode 17 is the gate of the FinFET and surrounds both vertical sides and the top of the body 20. It is separated from body 20 by gate oxide layer 19. When gate electrode 17 turns on the FinFET 10 (e.g., is a high voltage relative to source for an NFET), carriers conduct from first source/drain area 15 to second source/drain area 16 and other carriers conduct from the second source/drain area to the first source/drain area in a direction into (or out of) the page, in FIG. 2B, in portions of body 20 near gate oxide layer 19.

One will note in prior art FIG. 2B that the exposed surfaces of the body 20 and substrate 12 are totally surrounded by insulating material. Buried oxide 11 is at the bottom of substrate 12; recessed oxide 13 surrounds the sides of substrate 12; and gate oxide layer 19 surrounds the left, right, and top sides of body 20. Therefore, no electrical connection to body 20 may be made to control a voltage on the body 20, other than the P−/N+ junctions (for an NFET) between body 20 and first source/drain area 15 and second source/drain area 16. The body voltage, relative to a voltage on the first source/drain area 15 of the FET, tends to "float". For example, when the FET is "off", source to drain voltage may be relatively high, and junction current leakage from the drain may charge the body 20. However, if the body voltage becomes more than a diode drop difference from the source voltage, then the body/source junction will begin to forward bias, clamping the body voltage to be no more than one diode drop difference than the source voltage. (For silicon, diode drops are approximately 0.7 volts.)

Actual body voltage relative to the source depends on a number of factors, including temperature and switching history of the FET. A threshold voltage of a FET is dependent in part on a voltage difference between the source and the body 20. A number of circuits rely on a known source to body voltage for proper operation. Examples of such circuits that rely on a known source to body voltage for proper operation include, but are not limited to, differential receivers, operational amplifiers, and the like.

Circuits that rely on known source to body 20 voltages require the body 20 be tied to a voltage. Often, NFET bodies are coupled to ground and PFET bodies are tied to a positive supply, referred to as Vdd. FETs used in a differential stage having gates coupled to a true and a complement signal have their bodies coupled together. It would be advantageous to create a FinFET with a body contact structure so that the FinFET body may be coupled to a voltage supply, or to other FinFET bodies and still maintain functionality of the FinFET.

FIGS. 3A-19C show sequential views of exemplary manufacturing stages of an exemplary FinFET structure according to an embodiment. Figures with the same numeric label correspond to the same stage of manufacturing. Figures with the suffix "A" are top-down views. Figures with the suffix "B" or "C" are vertical cross-sectional views along the plane B-B' or C-C', respectively, of the corresponding figure with the same numeric label and the suffix "A." The Figures are not drawn to scale. The dimensions may vary in some embodiments. Also the shapes of the Figures may depict ideal shapes. Variations in actual manufacturing may result in structures deviating from the depicted figures.

Figure 3A:
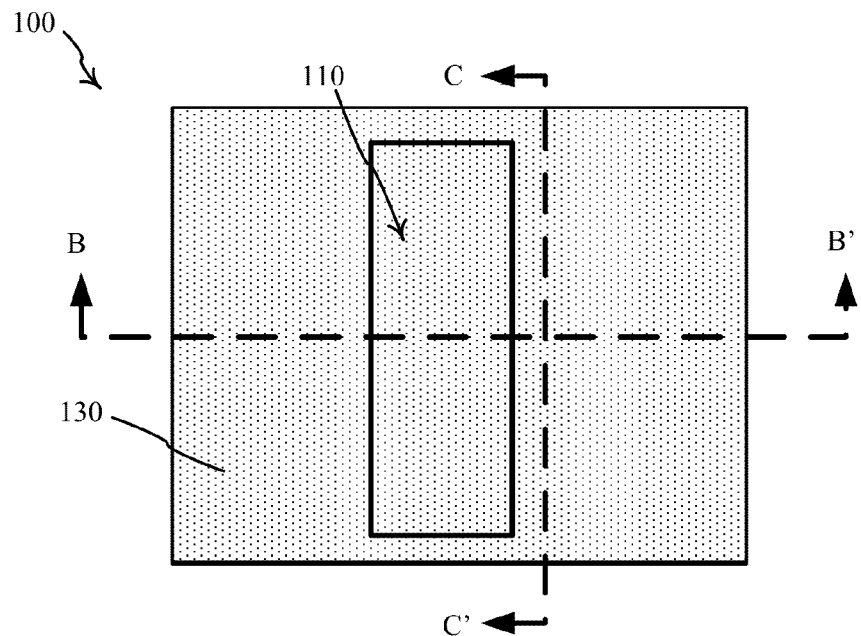
Figure 3B:
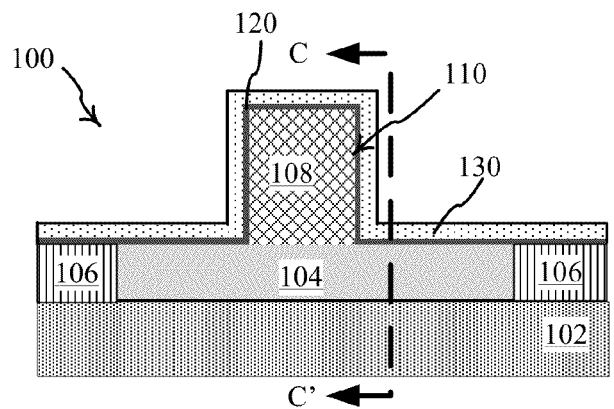
Figure 3C:
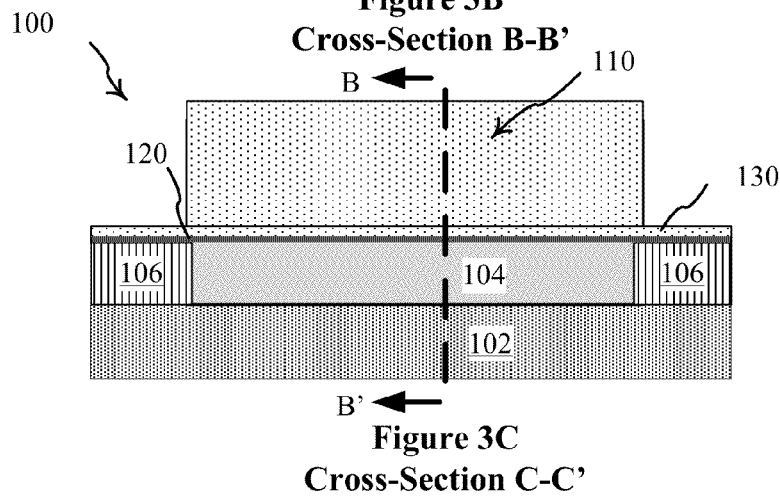

Referring to FIGS. 3A-3C, according to an aspect, a FinFET structure, as shown in the figures, may be fabricated according to known techniques. In FIGS. 3A-3C, the shown FinFET structure is referred to a semiconductor device 100. However, the semiconductor device 100 generally refers to the FinFET structure in the various manufacturing stages described herein. A buried oxide layer 102 may form the base of the semiconductor device 100. The buried oxide may be any insulator such as SiO2 or HfO2. A substrate 104 may be on the buried oxide layer 102. The substrate 104 may be single crystal silicon. However, substrate 104 may comprise other appropriate semiconducting materials, including, but not limited to, SiC, Ge alloys, GaP, InAs, InP, SiGe, GaAs, other III/V or II-VI compound semiconductors or other crystalline structures. The sides of the substrate 104 may be insulated by a recessed oxide layer 106. Recessed oxide layer 106 may be any suitable insulator/dielectric such as SO2 or HfO2.

A body area 108 is shown within a semiconductor fin 110 on the substrate 104. Fin 110 may be a silicon based structure that rises from substrate 104 and has a doping suitable for the body area 108 of a FET (e.g., P− doping, in the case of an NFET). The body area 108 may have a dopant concentration typically in the range from about $5.0*10^{14}/cm^3$ to about $5.0*10^{17}$. Besides silicon, the fin 110 may comprise other appropriate semiconducting materials, including, but not limited to, SiC, Ge alloys, GaP, InAs, InP, SiGe, GaAs, other III/V or II-VI compound semiconductors or other crystalline structures. The height of the fin 110 may be in the range from about 50 nm to 1000 nm, although larger or smaller heights are also contemplated. The width of the semiconductor fin 110 preferably is from 25 nm to 500 nm, although larger or smaller widths are also contemplated. The ratio between the height and width of the fin 110 may be of a ratio of 2:1, although other ratios are contemplated. Also the illustration of the fin 110 is an ideal shape of the fin 110. The fin 110 may be substantially rectangular in shape, however, variations in manufacturing may make the corners of the fin 110 rounded, and the vertical sides of the fin 110 may not be parallel with one another or perpendicular to polysilicon layer 130.

A gate oxide layer 120 has been deposited on the entire fin 110, substrate 104, and recessed oxide layer 106. Gate oxide layer 120 may be any dielectric suitable as a gate dielectric of a FET, for examples, SiO2 or HfO2. The gate oxide layer 120 may be very thin, as thin as 1 nm to 3 nm in thickness. A gate metal such as polysilicon is deposited over the gate oxide layer 120 forming a polysilicon layer 130. The polysilicon layer 130 may be thicker than gate oxide layer 120. Polysilicon layer 130 is suitable as a gate electrode material and is suitably doped as a conductor. Polysilicon layer 130 may be silicided (e.g., titanium silicide) to enhance conductivity. However, while polysilicon is the preferred material for gate electrodes, it will be appreciated that various other gate materials may be substituted for polysilicon. Some non-limiting examples of these materials include tungsten, titanium, tantalum, silicon nitride, silicides such as cobalt or nickel silicides, germanium, silicon germanium, other metals, and various combinations of the foregoing.

Figure 4A:
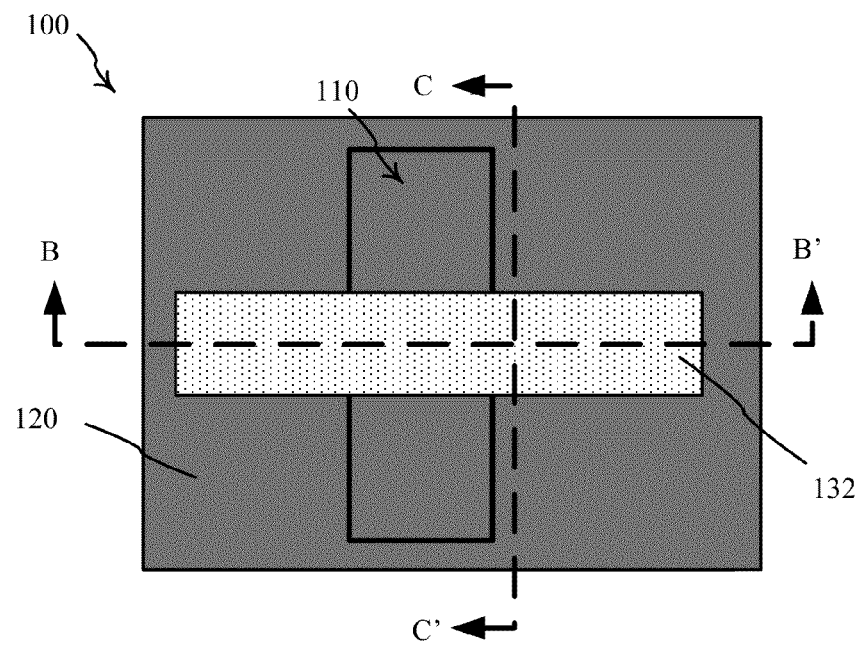
Figure 4B:
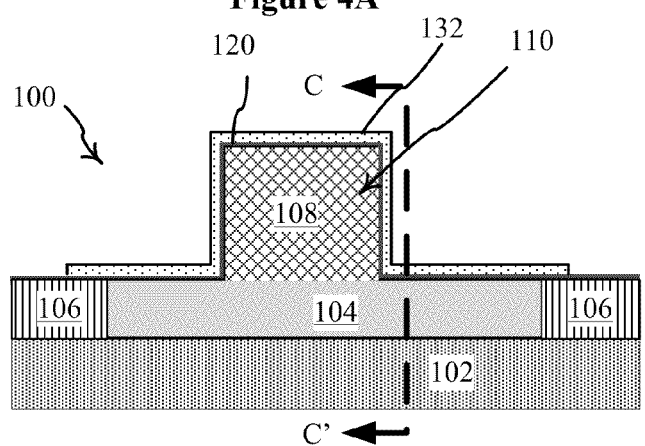
Figure 4C:
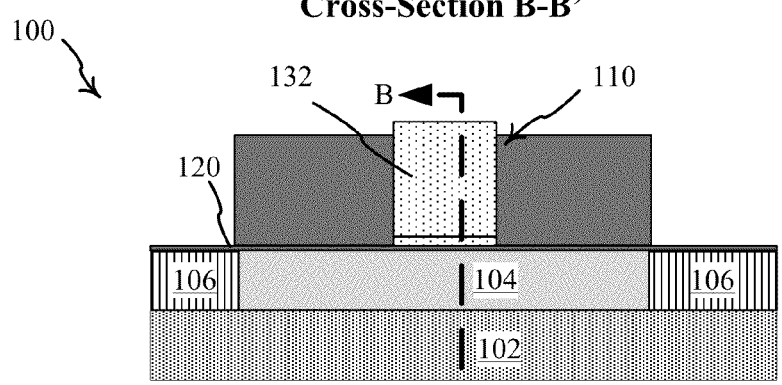

Referring to FIGS. 4A-4C, according to an aspect, a gate definition and etch is performed. The gate definition and etch removes portions of the polysilicon layer 130 (FIG. 3) from the semiconductor device 100 leaving a strip of the polysilicon layer 130 forming a gate electrode 132.

Figure 5A:
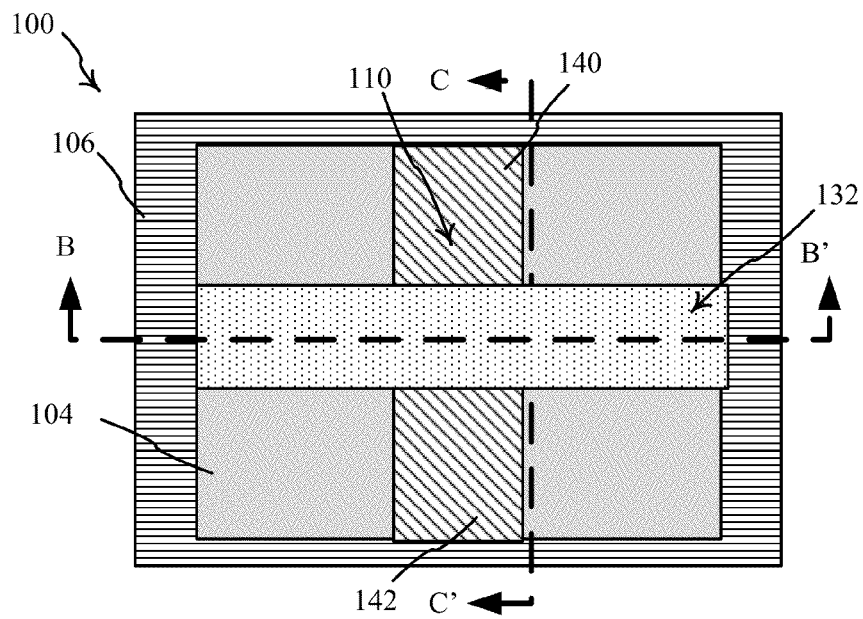
Figure 5B:
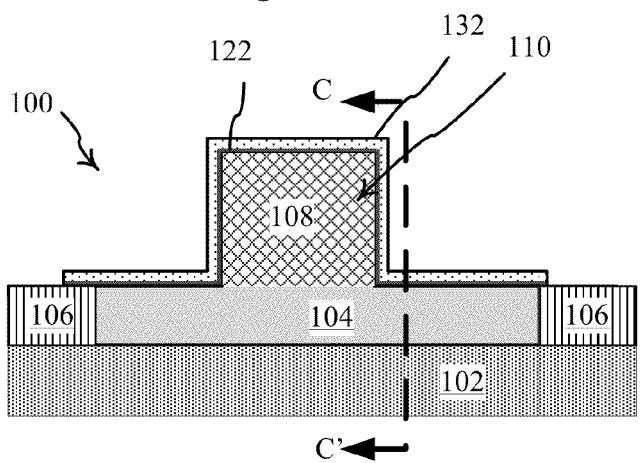
Figure 5C:
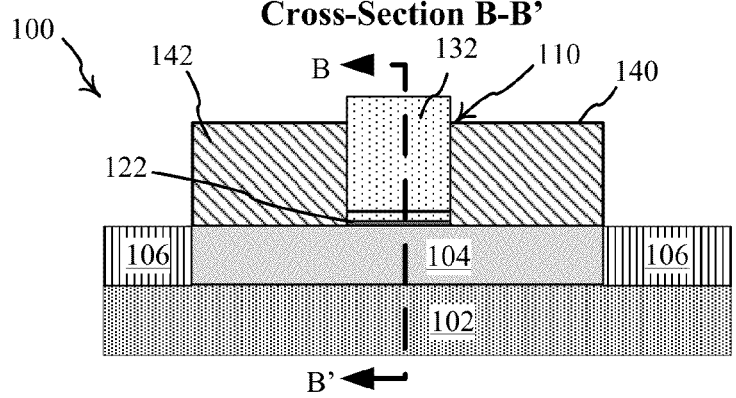

Referring to FIGS. 5A-5C, according to an aspect, the gate oxide layer 120 (FIG. 4) may be removed by an anisotropic etch. The gate oxide layer that remains under the gate electrode 132, now designated by reference number 122, isolates the gate electrode 132 from the fin 110. After deposition and selective etching of gate oxide layer 120 (FIG. 4) and polysilicon layer 130 (FIG. 3), an ion implant is performed using the remaining portions of gate oxide layer 122 and gate electrode 132 as a mask. The ion implant changes the doping of exposed portions of fin 110 to be suitable (e.g., N+ doping, in the case of an NFET) for a first source/drain area 140 and a second source/drain area 142 in the FETs herein disclosed. The source/drain areas 140 and 142 may have a dopant concentration from about $1.0*10^{19}/cm^3$ to about $5.0*10^{21}/cm^3$, and preferably from about $1.0*10^{20}/cm^3$ to about $1.0*10^{21}/cm^3$. The body area 108 retains its doping, which is the complementary doping of the source/drain areas 140 and 142 (e.g., P− doping, in the case of an NFET).

Figure 6A:
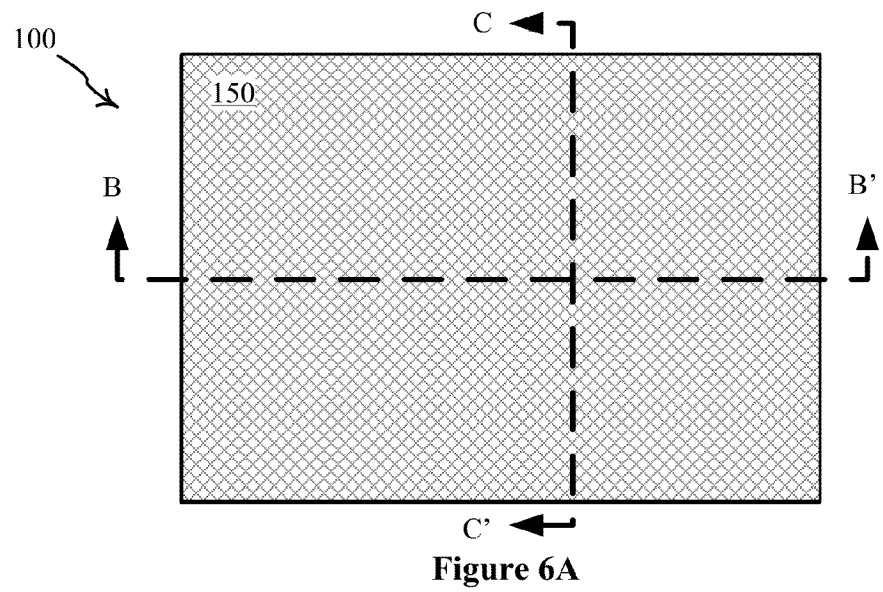
Figure 6B:
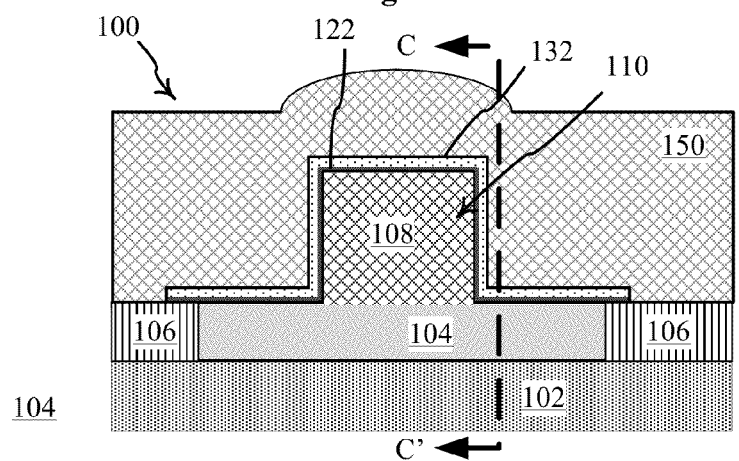
Figure 6C:
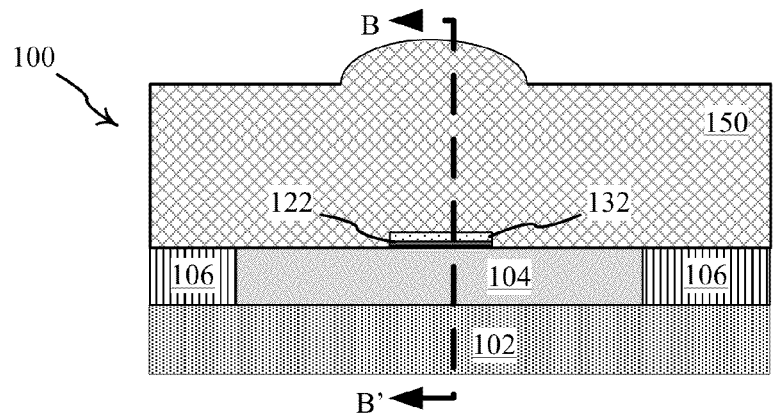

Referring to FIGS. 6A-6C, according to an aspect, an electrical insulator, insulator 150, may be deposited on the semiconductor device 100 to cover fin 110, substrate 104, gate oxide layer 122, and gate electrode 132. The insulator 150 may be a silicon dioxide SO2, HfO2, or any suitable insulator. SiO2 may be grown by exposing silicon to oxygen. Alternatively, oxide may be deposited. Growing high quality oxide with minimal contamination is time consuming. For this reason, insulator 150 may be grown as a thin oxide layer to provide a good electrical interface and then lesser qualities of silicon oxide may be deposited.

Figure 7A:
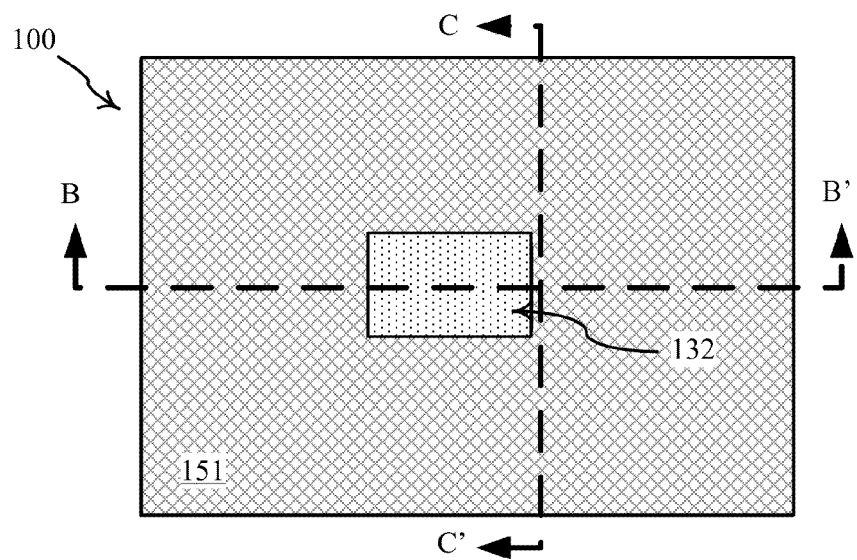
Figure 7B:
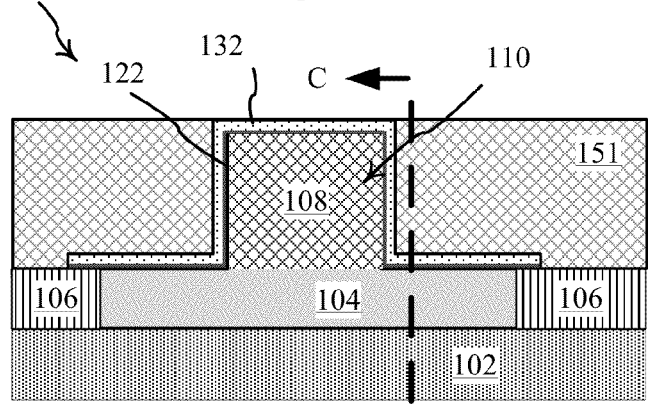
Figure 7C:
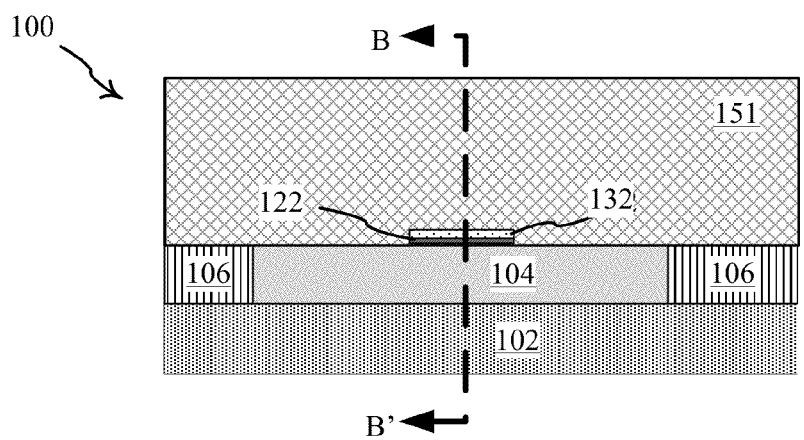

Referring to FIGS. 7A-7C, according to an aspect, the semiconductor device 100 of FIGS. 6A-6C may be planarized (e.g. chemical-mechanical polishing (CMP)), as shown, removing a portion of the insulator 150 to create a substantially uniform upper surface. The planarized insulator is designated by reference number 151. The planarization process may expose the upper surface of the gate electrode 132.

Figure 8A:
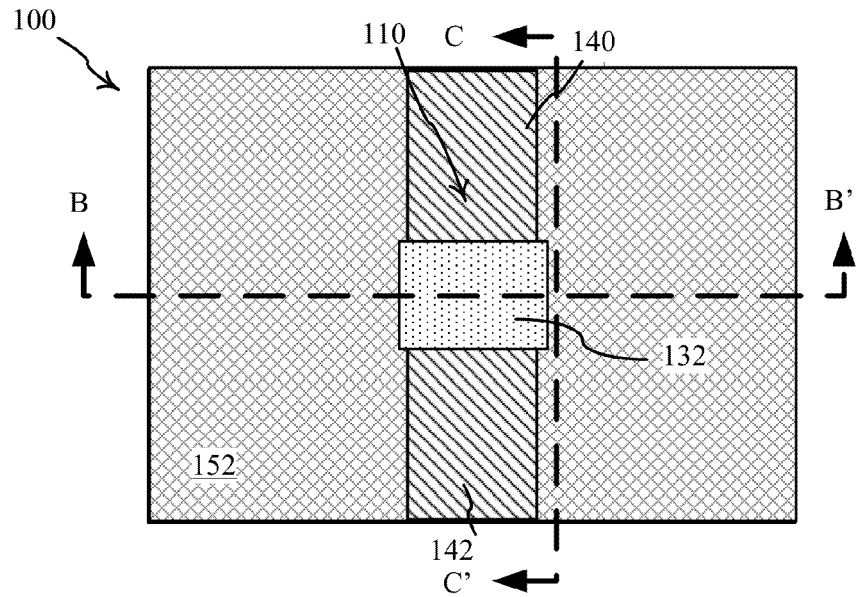
Figure 8B:
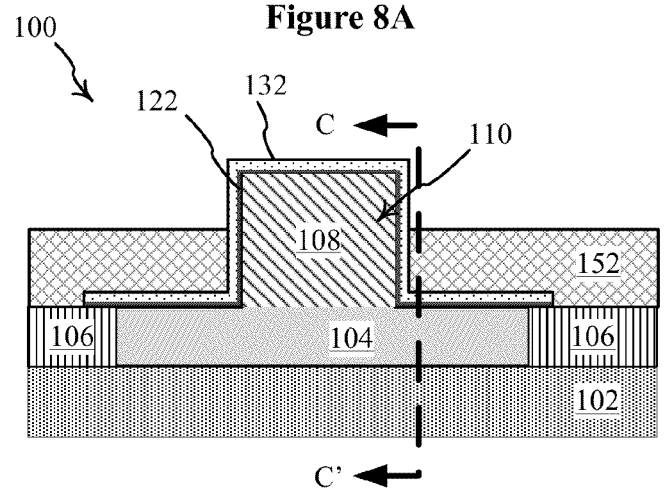
Figure 8C:
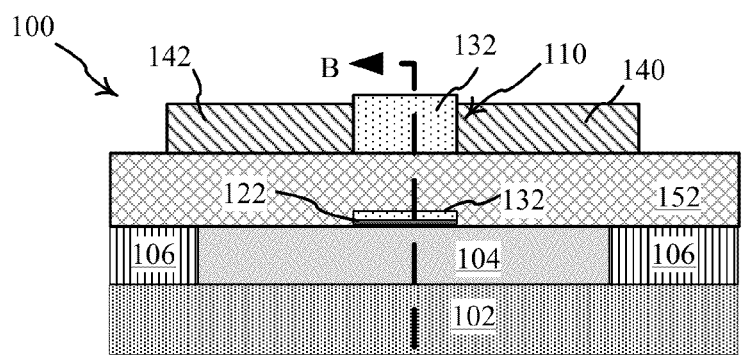

Referring to FIGS. 8A-8C, according to an aspect, the semiconductor device 100 of FIGS. 7A-7C may be subjected to a timed oxide etch to remove a portion of the insulator 151 to produce post-oxide etch insulator 152. The timed oxide etch exposes part of the first and second source/drain areas 140, 142 of the fin 110, but leaves a portion of the insulator 152 to cover the substrate 104 and recessed oxide 106.

Figure 9A:
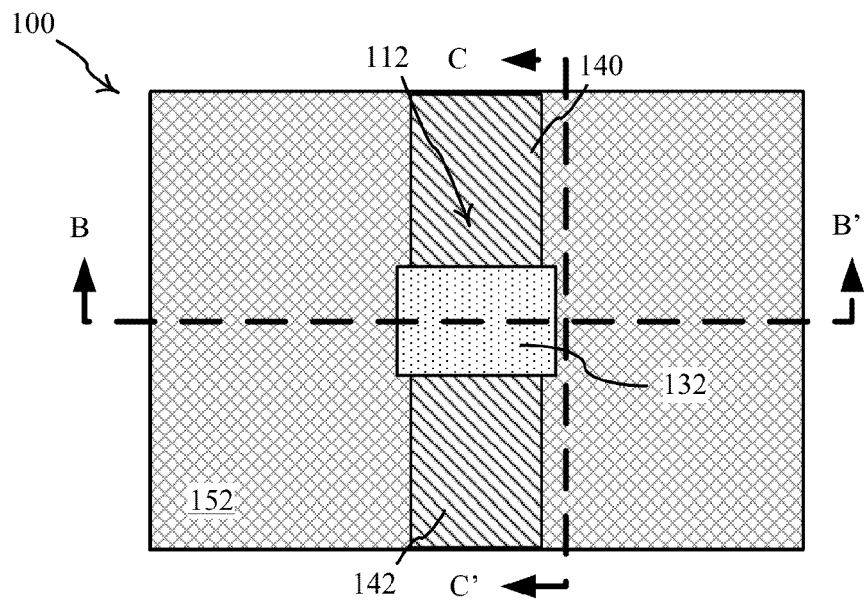
Figure 9B:
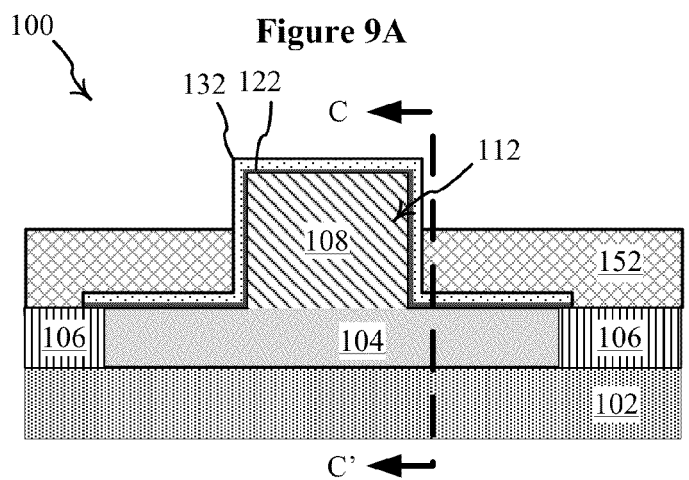
Figure 9C:
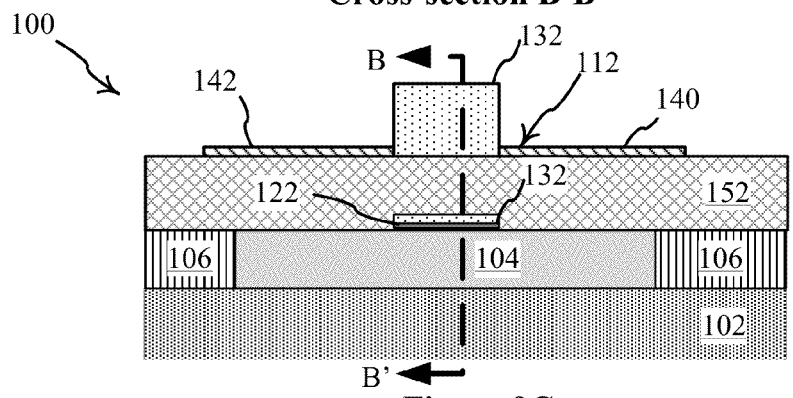

Referring to FIGS. 9A-9C, according to an aspect, a silicon etch may be performed to lower the first source/drain area 140 and second source/drain area 142 shown in FIGS. 8A-8C. The reduction in height may best be seen in FIG. 9C. Fin 110 is designated fin 112 after the silicon etch. The gate electrode 132 and gate oxide layer 122 isolate the body 108 of the fin 112 beneath the gate electrode 132. During the silicon etch, the gate electrode 132 may not be etched away to the degree that the first source/drain area 140 and second source/drain area 142 are etched away, especially if the gate electrode 132 is made of polysilicon that is silicided. This leaves a portion of the body 108 of the fin 112 higher than the first source/drain area 140 and second source/drain area 142 of the fin 112. Lowering the first source/drain area 140 and second source/drain area 142 avoids epitaxially growing silicon on the source/drain areas 140, 142 during a subsequent manufacturing process, described below with respect to FIGS. 14A-C, in which a semiconductor material is epitaxially grown on the body 108.

Figure 10A:
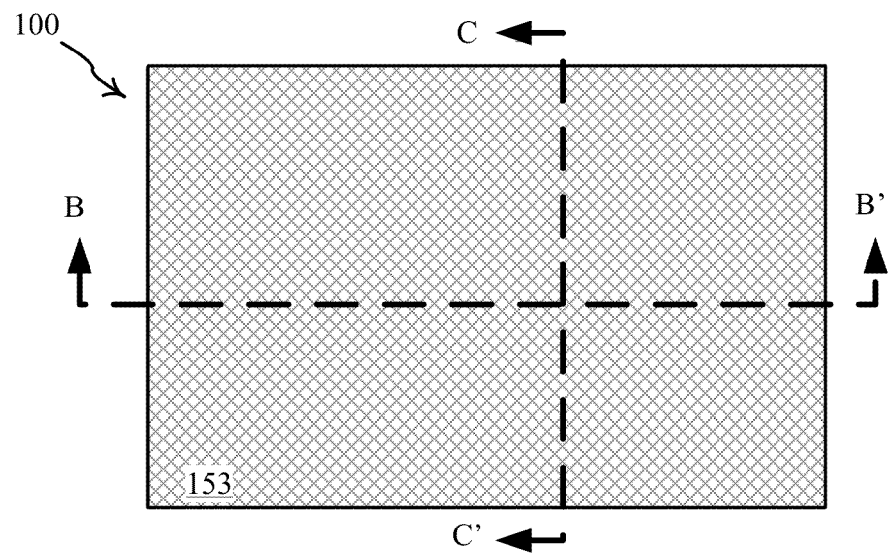
Figure 10B:
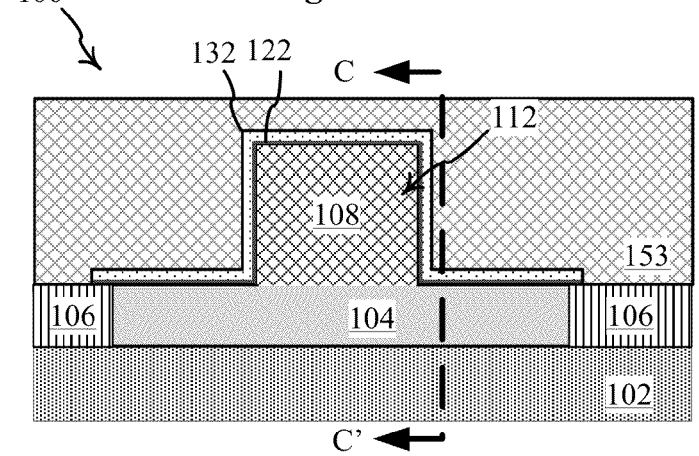
Figure 10C:
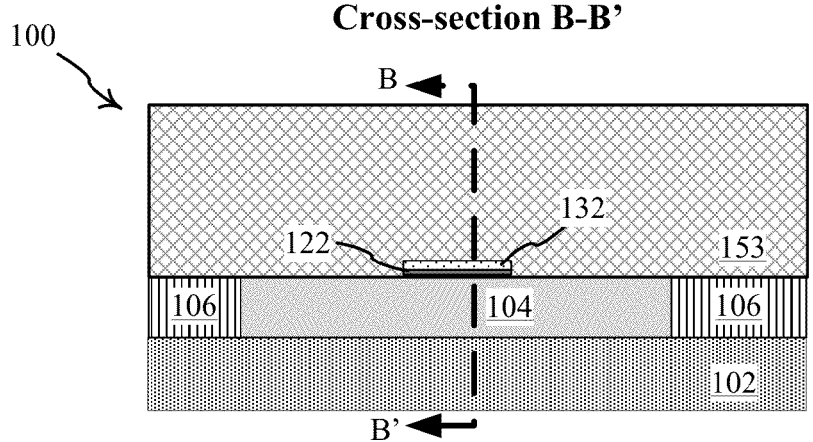

Referring to FIGS. 10A-10C, according to an aspect, additional insulator may be deposited on the semiconductor device 100 of FIGS. 9A-9C. The previously deposited insulator 152 together with the additional insulator deposited at this stage is designated by reference number 153. As may be seen from the figures the insulator 153 covers the gate electrode 132.

Figure 11A:
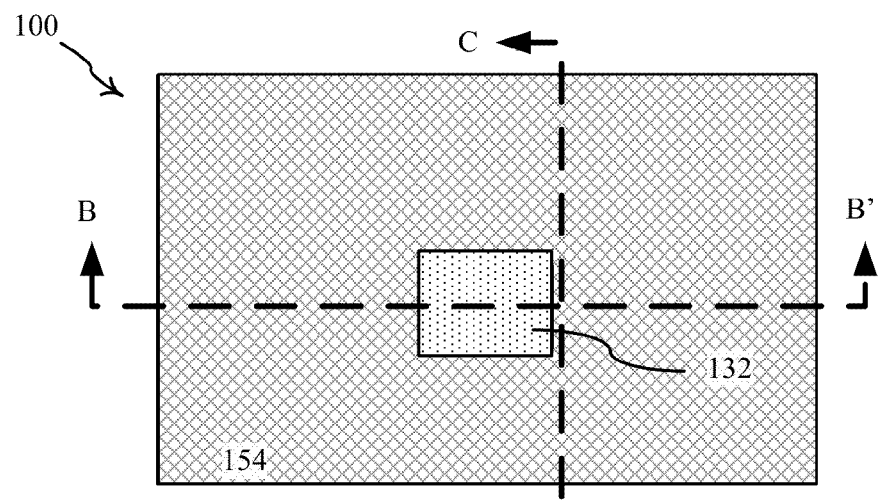
Figure 11B:
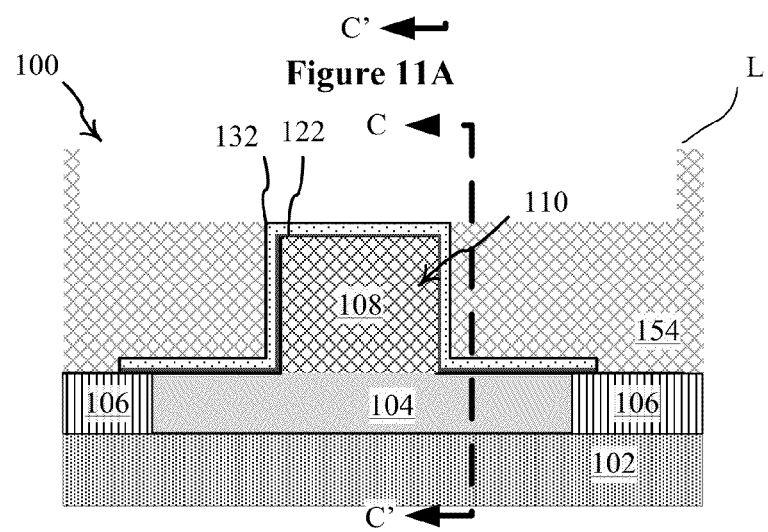
Figure 11C:
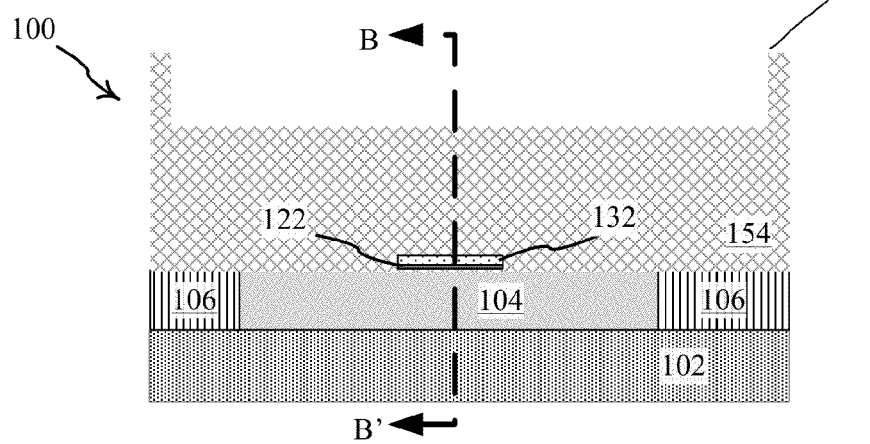

FIGS. 11A-11C, according to an aspect, show a processing step of an embodiment of the semiconductor device 100 of FIGS. 10A-10C. A timed oxide etch removes a portion of the insulator 153 forming insulator 154, as depicted, exposing an upper surface of the gate electrode 132. Gate electrode 132 and gate oxide layer 122 cover a top surface of fin 112. The first source/drain area 140 and second source/drain area 142 of the fin 112 are insulated by insulator 154. The timed oxide etch may leave a lip or projecting edge L of insulator at each of the four edges of the semiconductor device 100.

Figure 12A:
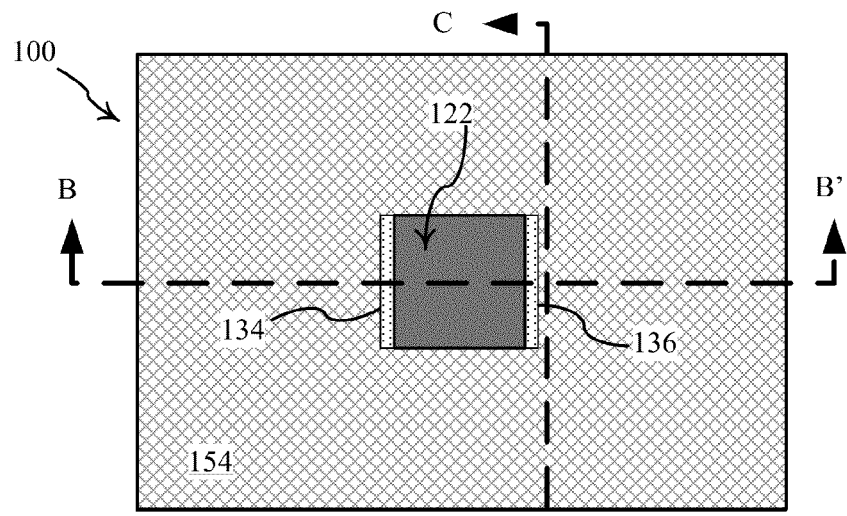
Figure 12B:
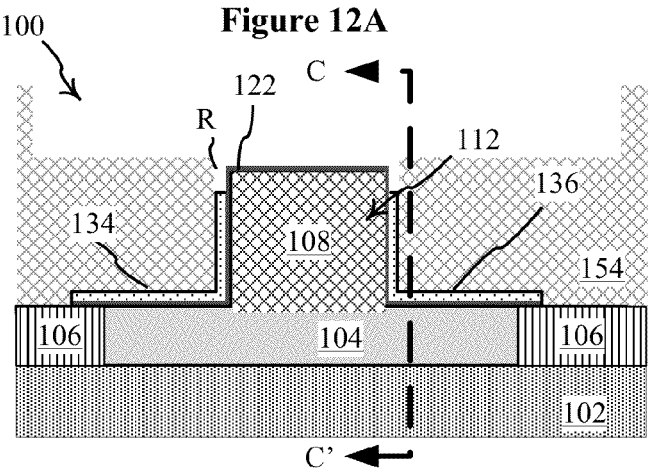
Figure 12C:
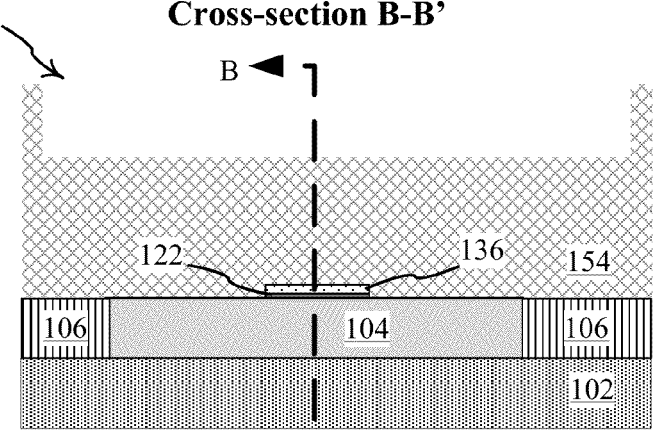

FIGS. 12A-12C, according to an aspect, show another processing step of a selective polysilicon etch to remove the portion of gate electrode 132 that is on the top surface of fin 112 of the semiconductor device 100 of FIGS. 11A-11C. As may best be seen in FIG. 12B the gate electrode 132, now designated reference numbers 134 and 136, is no longer contiguous. However, the gate oxide layer 122 may remain contiguous after this step. The first gate electrode 134 and a second gate electrode 136 are the respective gates for first and second FET structures. The first gate electrode 134 and second gate electrode 136 may be slightly over-etched, resulting in recesses R on the left and on the right of the fin 112. This over-etching of the gate electrode 132 is performed to prevent the gate electrodes 134, 136 from becoming shorted with (i.e., contacting) an epitaxial growth structure 160 extending from the body area 108 that is added in a subsequent process described below with respect to FIGS. 14A-14C. To keep the gate electrodes 134 and 136 insulated from the epitaxial growth structure 160 of FIGS. 14A-14C, additional insulator may optionally be applied to the recesses R of the semiconductor device 100 in FIGS. 12A-12C and the insulator may be etched accordingly FIGS. 13A-13C, according to an aspect, show the semiconductor device 100 of FIGS. 12A-12C after a selective oxide etch to remove the portion of gate oxide layer 122 that remained on the top surface of fin 110 exposing the body area 108, thereby leaving gate oxide layers 124 (left portion) and 126 (right portion) as shown.

Figure 14A:
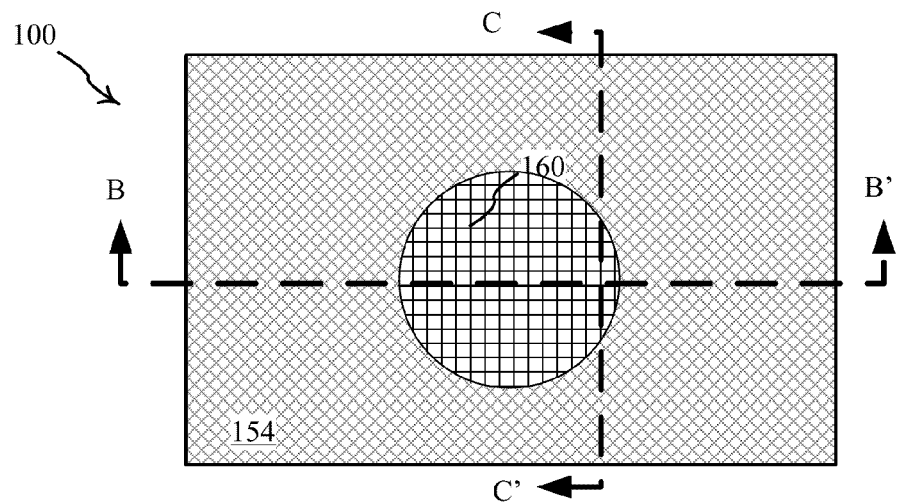
Figure 14B:
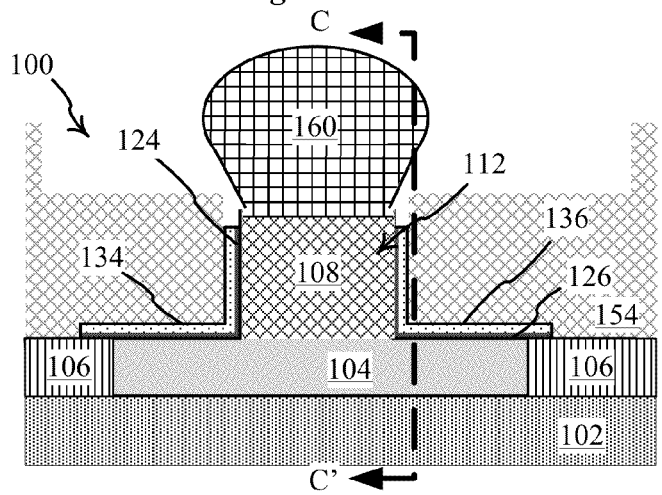
Figure 14C:
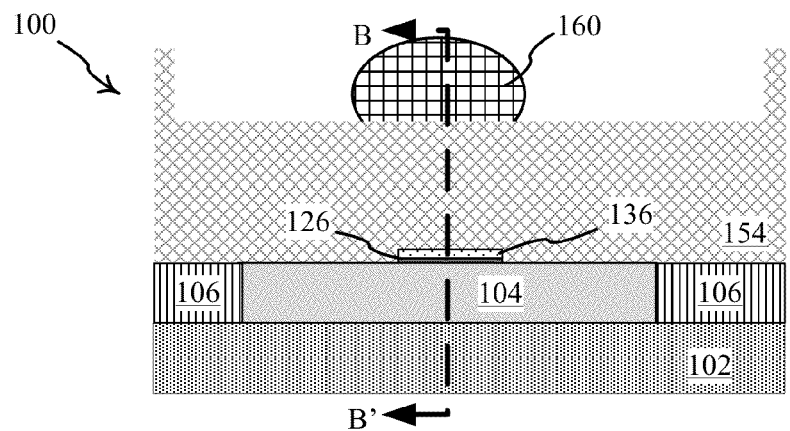

FIGS. 14A-14C, according to an aspect, show the semiconductor device 100 of FIGS. 13A-13C where a mushroom or a balloon like structure, referred to herein as epitaxial growth structure 160, may be formed by epitaxially growing silicon on the exposed body area 108 of the fin 112. As may best be seen in FIG. 14B, the epitaxial growth structure 160 may be wider than the width of body area 108 of the fin 112 that is between the two FET structures. As shown in FIG. 14B, the widest portion of epitaxial growth structure 160 may extend beyond the vertical portions of gates 134, 136. As may best be seen in FIGS. 14A and 14C, the widest portion of epitaxial growth structure 160 may extend to either side of the fin 112. The epitaxial growth structure 160 tends to grow at a 1:1 ratio from the body area, meaning that for every unit of height increase, the radius of the epitaxial growth structure 160 increases by a unit. The epitaxial growth structure 160 may not grow or may grow only slightly from the top exposed portions of the polysilicon in first and second gate electrodes 134, 136 because epitaxial growths do not grow well on polysilicon and silicided materials. The epitaxial growth structure 160 and the body area 108 may be the same semiconductor material so the epitaxial growth structure 160 may readily bond to the body area 108 in this stage of manufacturing.

Figure 15A:
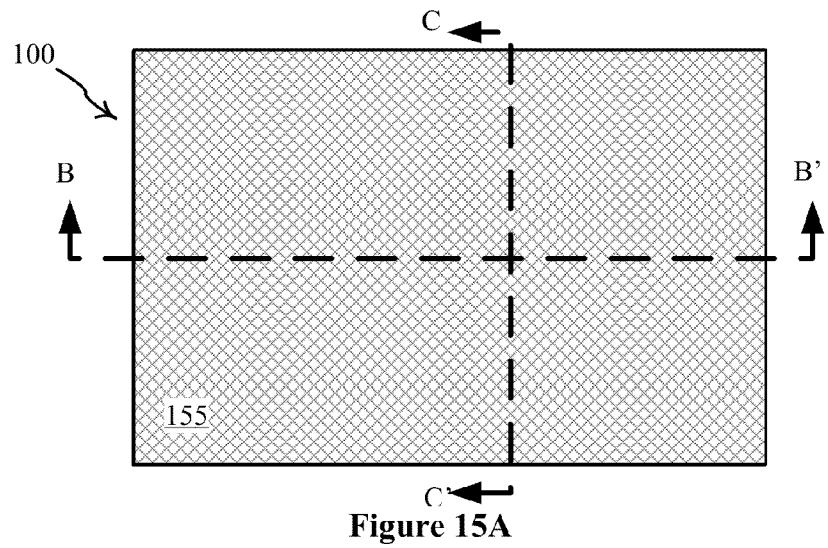
Figure 15B:
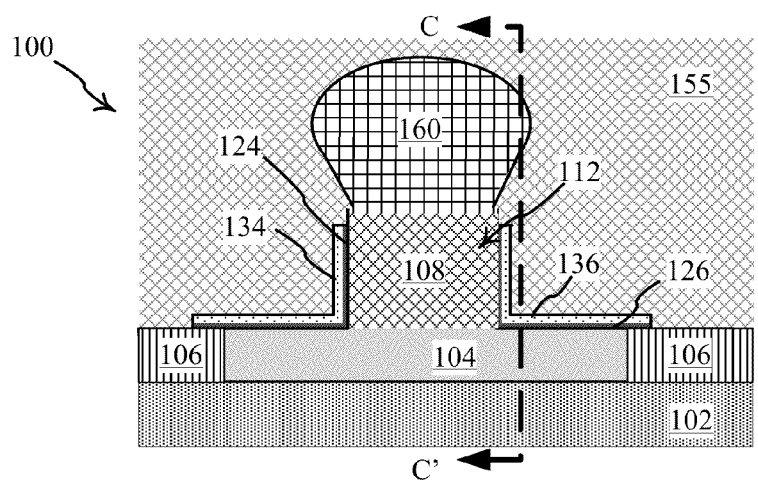
Figure 15C:
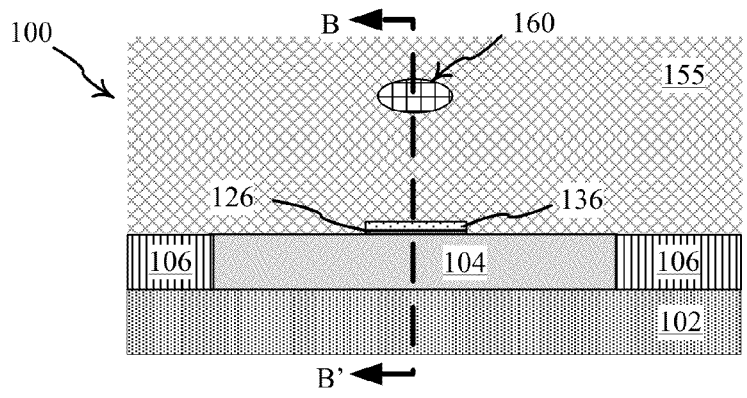

In FIGS. 15A-15C, according to an aspect, additional insulator may be added to insulator 154 increasing the height of insulator 154, as shown, to form insulator 155. Insulator 155 may cover the entire epitaxial growth structure 160 (including the top) of semiconductor device 100 of FIGS. 14A-14C. Alternatively, insulator 155 may cover a portion of the epitaxial growth structure 160, leaving a portion of the top of the epitaxial growth structure 160 uncovered.

Figure 16A:
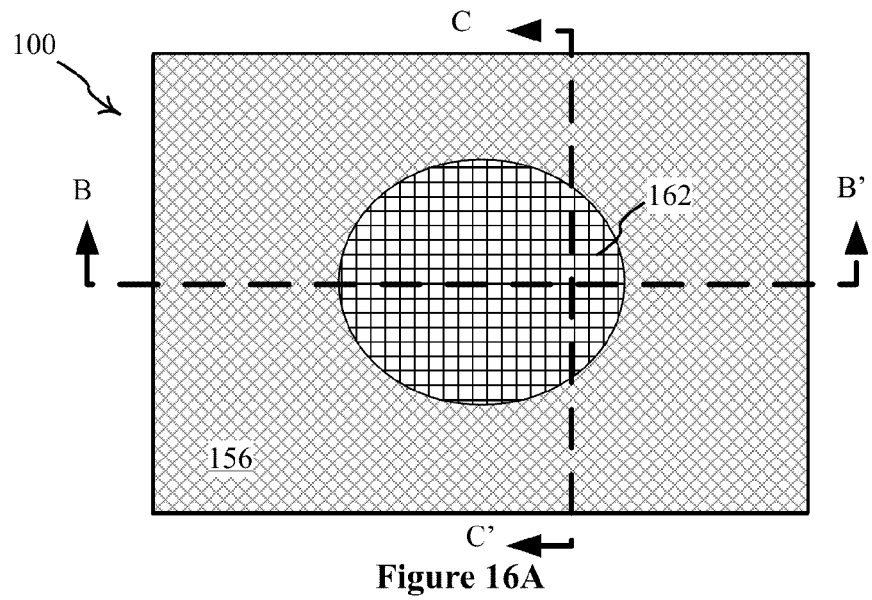
Figure 16B:
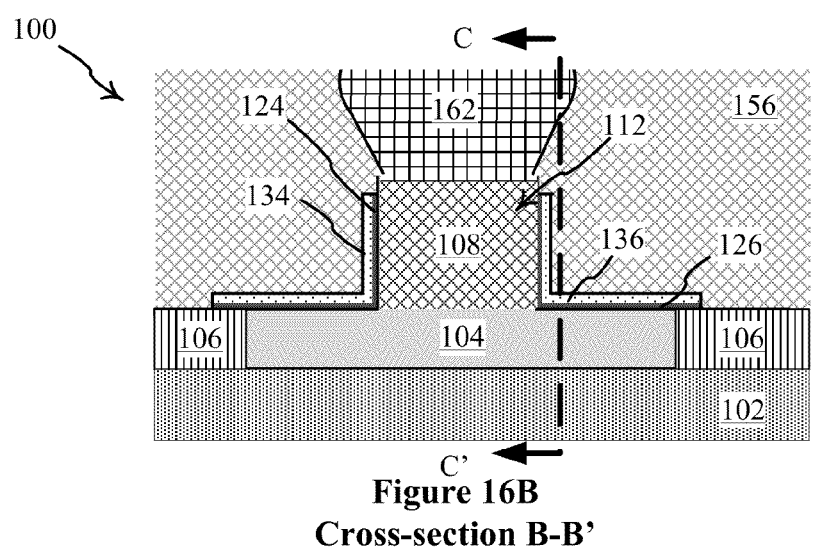
Figure 16C:
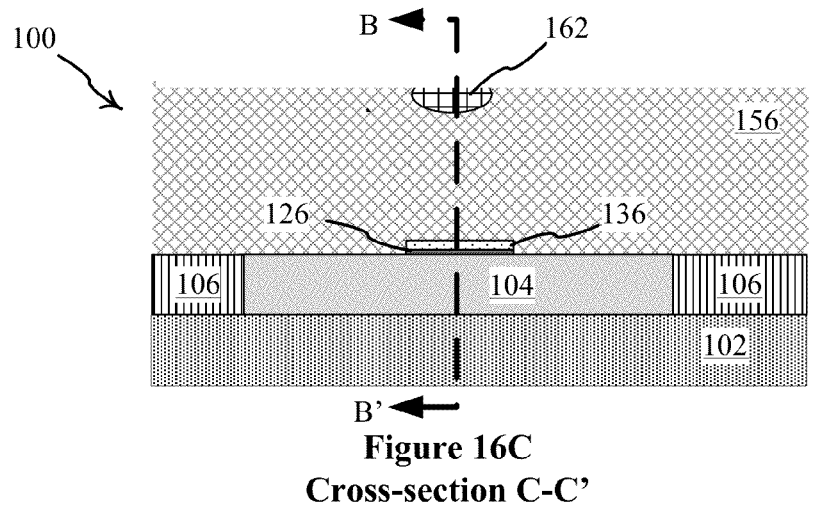

In FIGS. 16A-16C, according to an aspect, the semiconductor device 100 of FIGS. 15A-15C may undergo planarization (CMP), reducing the height of the device 100. The planarization process may reduce the height of a portion of the epitaxial growth structure 160. In addition, the planarization process may reduce the height of insulator 155 to form insulator 156. The planarization process exposes a relatively wide top surface of the epitaxial growth structure 160, forming the top fin area 162. The top fin area 162 of the fin 112 may have a width that extends beyond the vertical portions of the gate electrodes 134, 136 of the two FET structures on the vertical sides of the body area 108. The width of the top fin area 162 may be substantially wider than the width of the body area 108. Preferably, the widest portion (before CMP) of the epitaxial growth structure 160 is exposed. For example, the width of the top fin area 162 compared to the width of the body area 108 may be two or three times as wide. As described below with respect to FIGS. 19A-19C, a body contact structure 180 is coupled with the top fin area 162 in a subsequent process. The larger the surface area exposed on the top fin area 162, the better the ability to couple this body contact structure 180 and the top fin area 162. However, the top fin area 162 should not be so wide as to prohibit access to the first or second source/drain areas 140, 142 (FIGS. 5A-5C).

The top fin area 162 may be doped with the same dopants as the body area 108. The top fin area 162 may be heavily doped compared to the body area 108. The top fin area 162 may have a dopant concentration from about $1.0*10^{19}/cm^3$ to about $5.0*10^{21}/cm^3$ and preferably from about $1.0*10^{20}/cm^3$ to about $1.0*10^{21}/cm^3$. This doping increases conductivity between the body contact structure to be subsequently formed and the top fin area 162 of the semiconductor device 100. This doping also serves to compensate any residual doping in the body area 108 that may have been caused by diffusion of the doping of the source/drain areas 140, 142 into the body area 108, thus avoiding shorts between the body contact and the source/drain areas 140, 142. In one embodiment, to reduce the dopant concentration from increasing in the body area 108 due to the high dopant concentration in the top fin area 162, the top fin area 162 may be doped in a manner that creates a doping gradient through the top fin area 162. In this embodiment, there is a higher doping concentration at the top of the top fin area 162 and a lower doping concentration where the top fin area 162 is coupled to the body area 108.

Figure 17A:
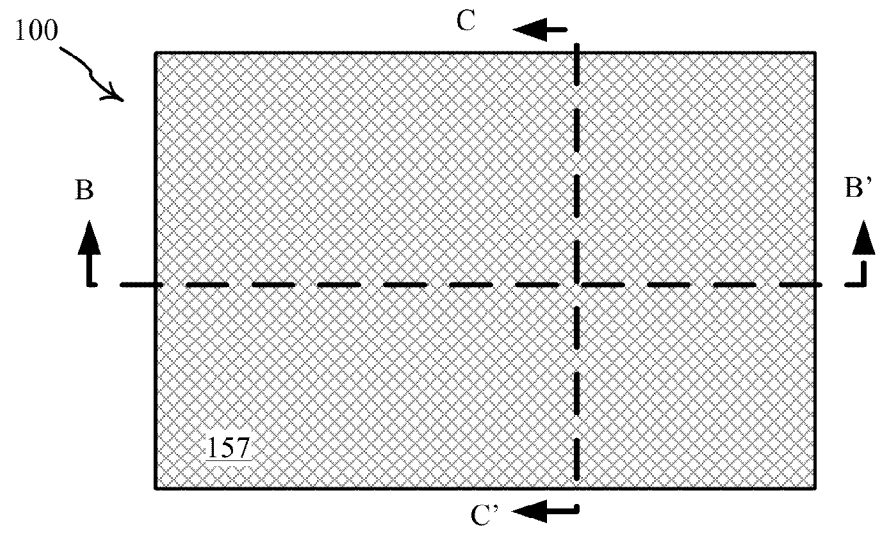
Figure 17B:
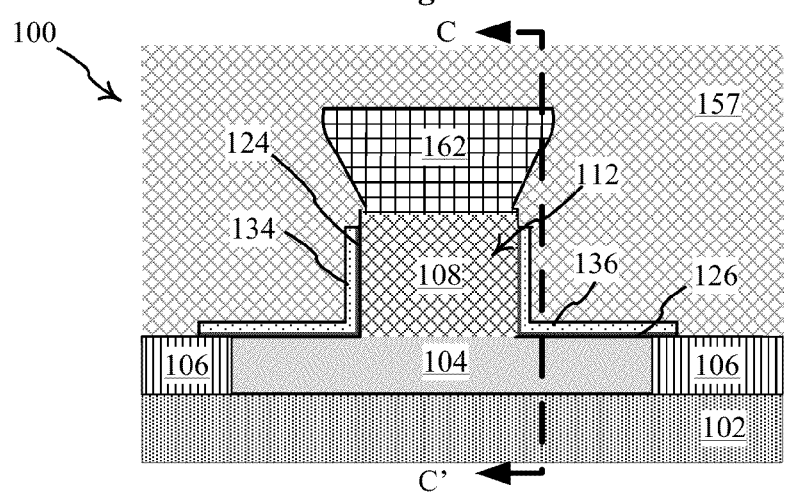
Figure 17C:
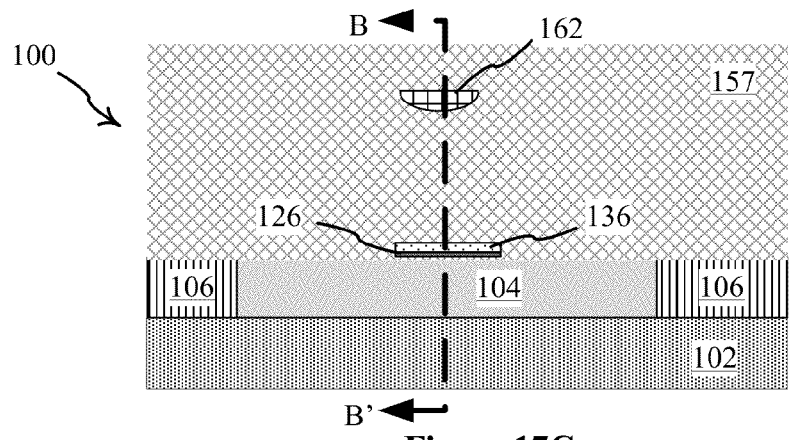

In FIGS. 17A-17C, according to an aspect, additional insulator may be added to insulator 156 forming insulator 157, increasing the height of insulator 156 as shown of semiconductor device 100 of FIGS. 16A-16C.

Figure 18A:
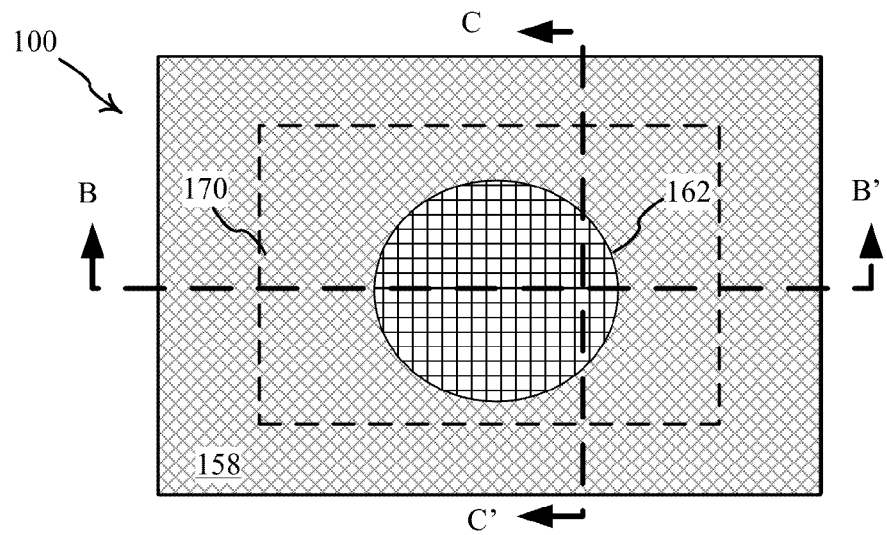
Figure 18B:
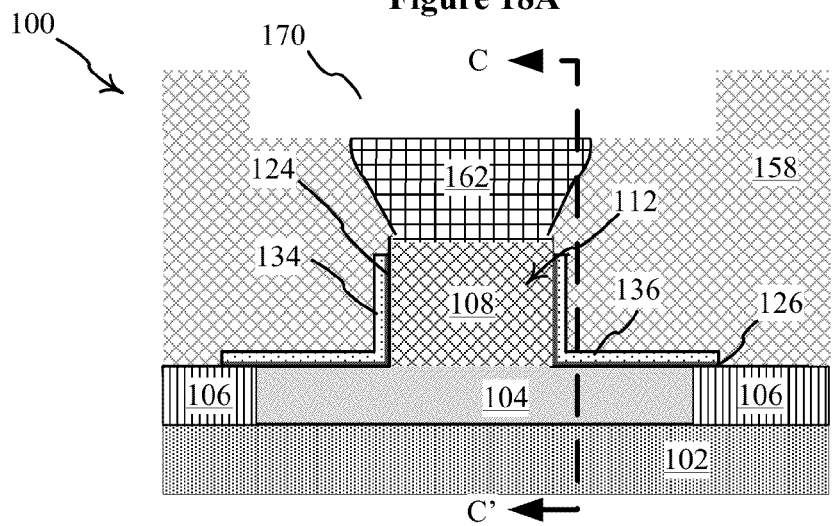
Figure 18C:
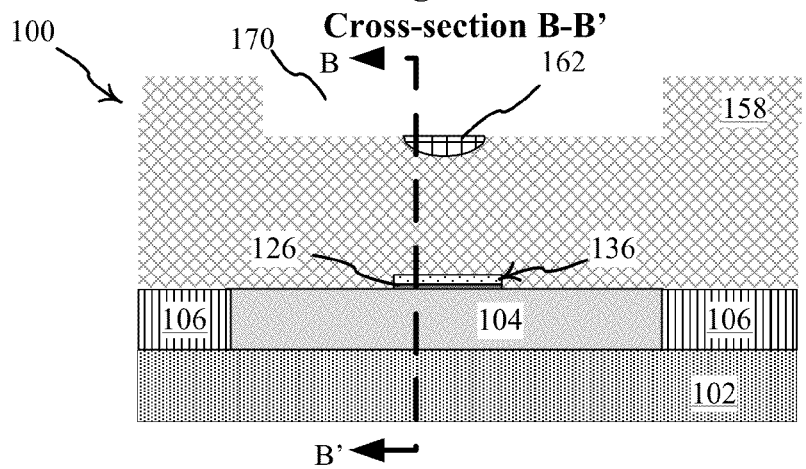

In FIGS. 18A-18C, according to an aspect, a hole 170 may be selectively etched in the insulator 157 of the semiconductor chip 100 of FIGS. 17A-17C to expose the top fin area 162.

The hole 170 may be best seen in FIGS. 18B and 18C. The selective etch forms insulator 158. The hole 170 may be formed to be wider than the width of the exposed surface area of the top fin area 162. The hole 170 provides a relatively large area for the deposited body contact structure 180 (added in a subsequent processing step, which is described with reference to FIGS. 19A-19C) since there is a greater chance for the body contact structure 180 to be in some contact with the top fin area 162.

Figure 19A:
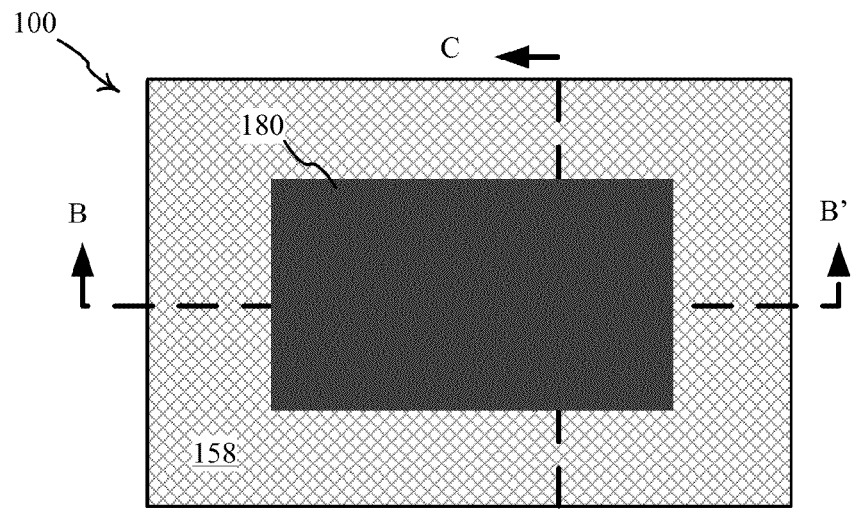
Figure 19B:
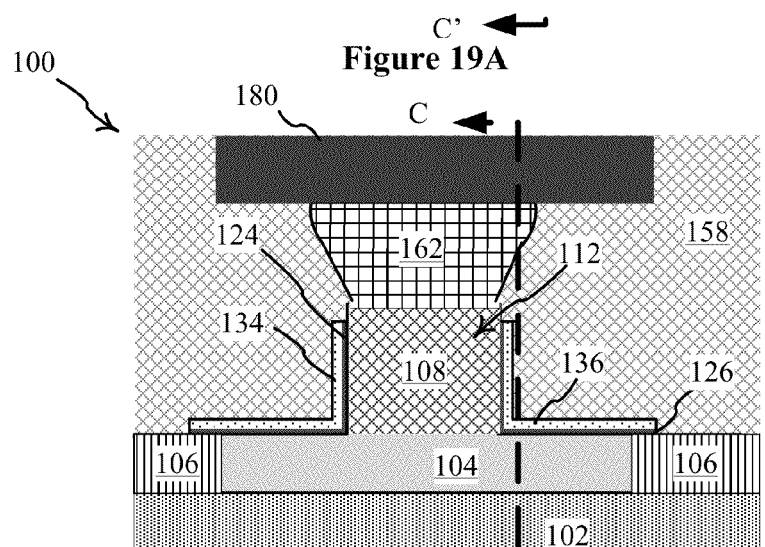
Figure 19C:
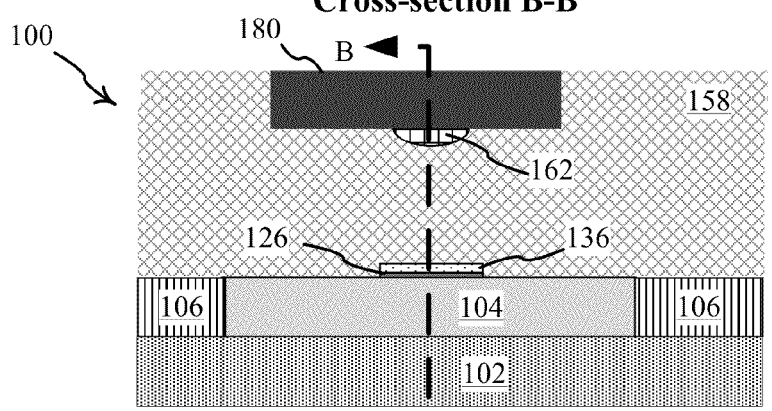

FIGS. 19A-19C, according to an aspect, the body contact structure 180 may be deposited in the etched hole 170 to couple the body contact structure 180 with the top fin area 162. Because hole 170 and contact structure 180 are larger than the exposed top of top fin 160, alignment, including statistical layout and alignment variation, may be facilitated. The body contact structure 180 is typically tungsten (W) but may be any suitable conductive material such as: Ti, Ta, Cu, or Al. Also, the body contract structure 180 may also include a metal compound liner such as TaN, TiN, and WN to improve adhesion or other structural and electrical properties of the body contact structures 180. The body contact structure 180 may be coupled to any desired circuit node (e.g. supply voltage, ground, a body of another circuit, or to an output of another circuit using interconnect structures). The semiconductor device 100 thus formed allows for enhanced coupling of the body contact structure 180 with the gated body 108 of fin 112. The body contact structure 180 is electrically isolated from the first source/drain area 140 and second source/drain area 142, and also from the first gate electrode 134 and the second gate electrode 136.

Figure 20:
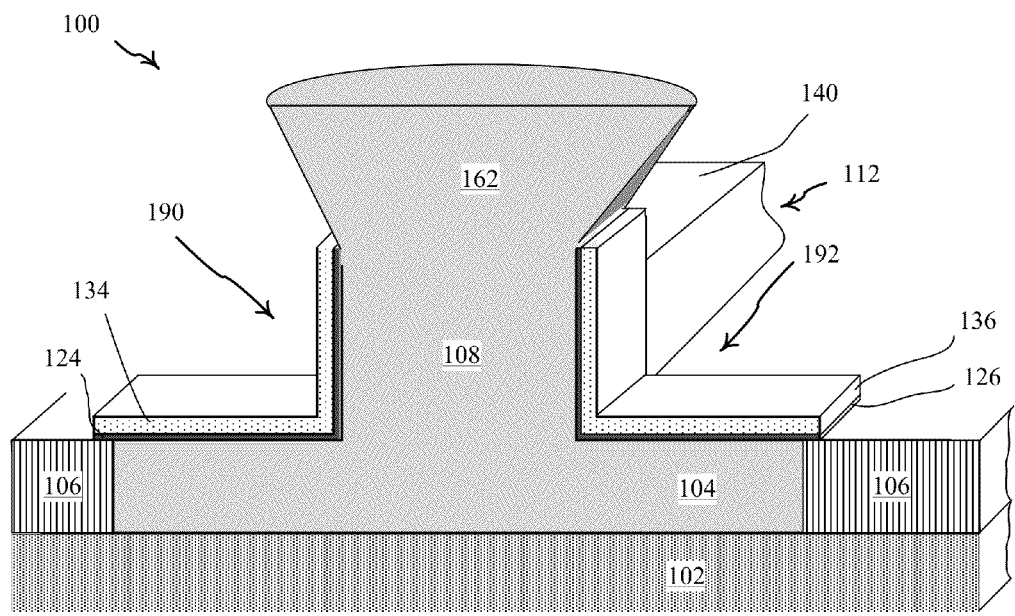
FIG. 20 shows a three dimensional view of a FinFET structure having two independently controllable, parallel connected FET devices and a top fin area for receiving a body contact structure according to an embodiment.

FIG. 20 shows a perspective, cross-sectional view of the semiconductor device 100 illustrated in FIGS. 19A-19C, with the insulator 158 and body contact structure 180 omitted for clarity. The first source/drain area 140 (FIG. 5A) is shown. The view in FIG. 20 is a cross section through the fin 112 in a region of the fin 112 where the FETs are formed, e.g., along line B-B' of FIG. 19A. FIG. 20 illustrates a FinFET with the semiconductor fin 112 formed on the substrate 104. The fin 112 further has a body area 108 having substantially the same width between two or more vertical surfaces and a top fin area 162 extending from the body area 108, the width of the top fin area 162 being wider than the width of the body area 108 for receiving a body contact structure 180. The fin 112 has a first FET 190 having a first gate electrode 134. The first gate electrode 134 may include a first polysilicon layer formed on a first vertical surface of the fin 112. The gate oxide layer 124 separates the fin 112 from the first polysilicon layer. In addition, the fin 112 has a second FET 192 having a second gate electrode 136. The second gate electrode 136 may include a second polysilicon layer formed on a second vertical surface of the fin 112. The gate oxide layer separates the fin 112 from the second polysilicon layer. The second gate electrode 136 may be electrically independent or isolated from the first gate electrode 134.

In one embodiment, the FinFET shown in FIG. 20 includes first and second source/drain areas which are formed above the substrate. When the first FET 190 is turned on (i.e., place in linear or saturation regions), a current path through the body area 108 is established. In addition, a body contact structure 180 may be coupled with top fin area 162 as previously described, in various embodiments.

Figure 21:
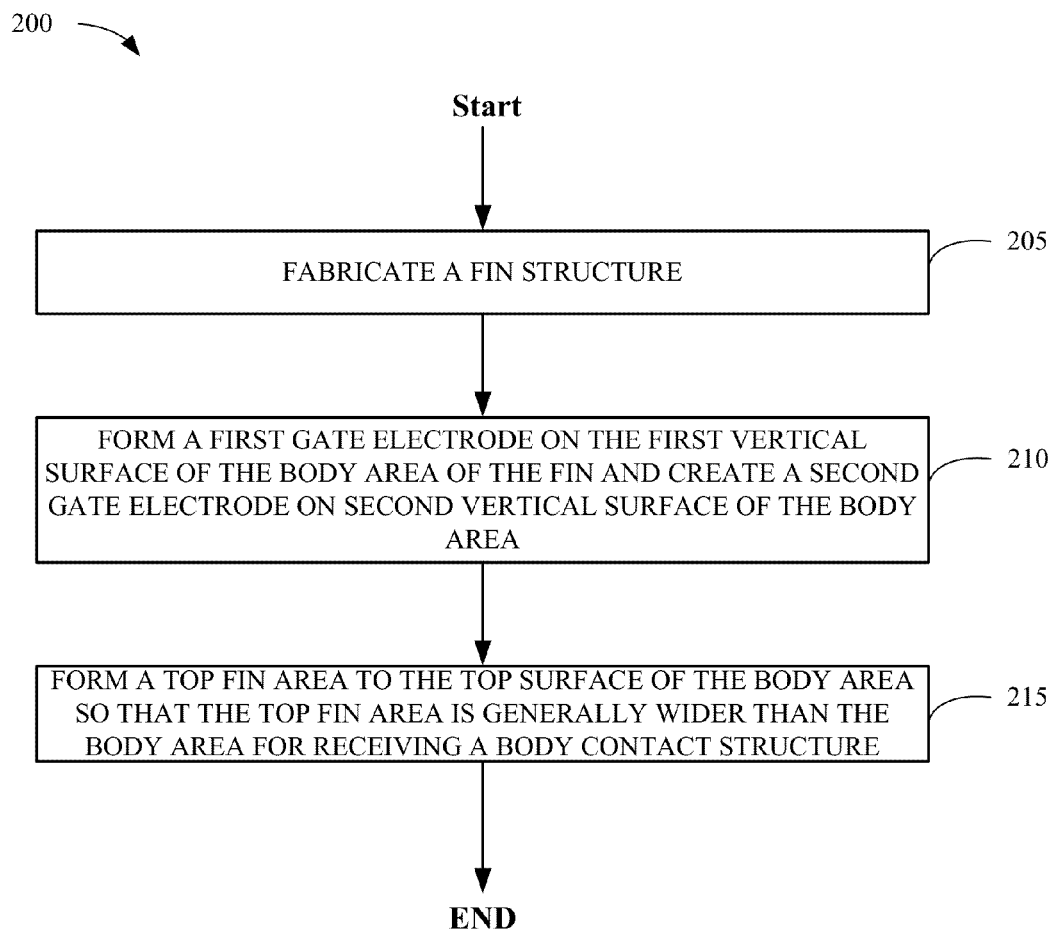
FIG. 21 shows a flowchart of a method of making a FinFET with the body contact structure according to an embodiment.

FIG. 21 shows a method 200 of making a FinFET having a body contact structure 180 according to one embodiment. In operation 205 a fin structure having the semiconductor fin 112 on the substrate 104 is fabricated. The fin 112 may have body area 108 that is substantially the same width between two or more vertical surfaces. The vertical surfaces may be substantially perpendicular to the substrate 104. In operation 210, a first FET 190 is formed having the first gate electrode. The first gate electrode 134 may be made up of a first polysilicon layer formed on a first vertical surface of the fin 112. The operation 210 may include providing the gate oxide layer 124, which separates the fin 112 from the first polysilicon layer. In addition, the operation 210 may include forming a second FET 192 having a second gate electrode 136. The second gate electrode may be made up of a second polysilicon layer formed on a second vertical surface of the fin 112. The operation 210 may include providing the gate oxide layer 126, which separates the fin 112 from the second polysilicon layer. The second gate electrode 136 may be electrically independent or isolated from the first gate electrode 134.

In operation 215, a top fin area 162 is added extending from the top surface of the body area 108 of the fin 112. The width of the top fin area 162 is wider than the width of the body area 108 for receiving a body contact structure 180.

Figure 22:
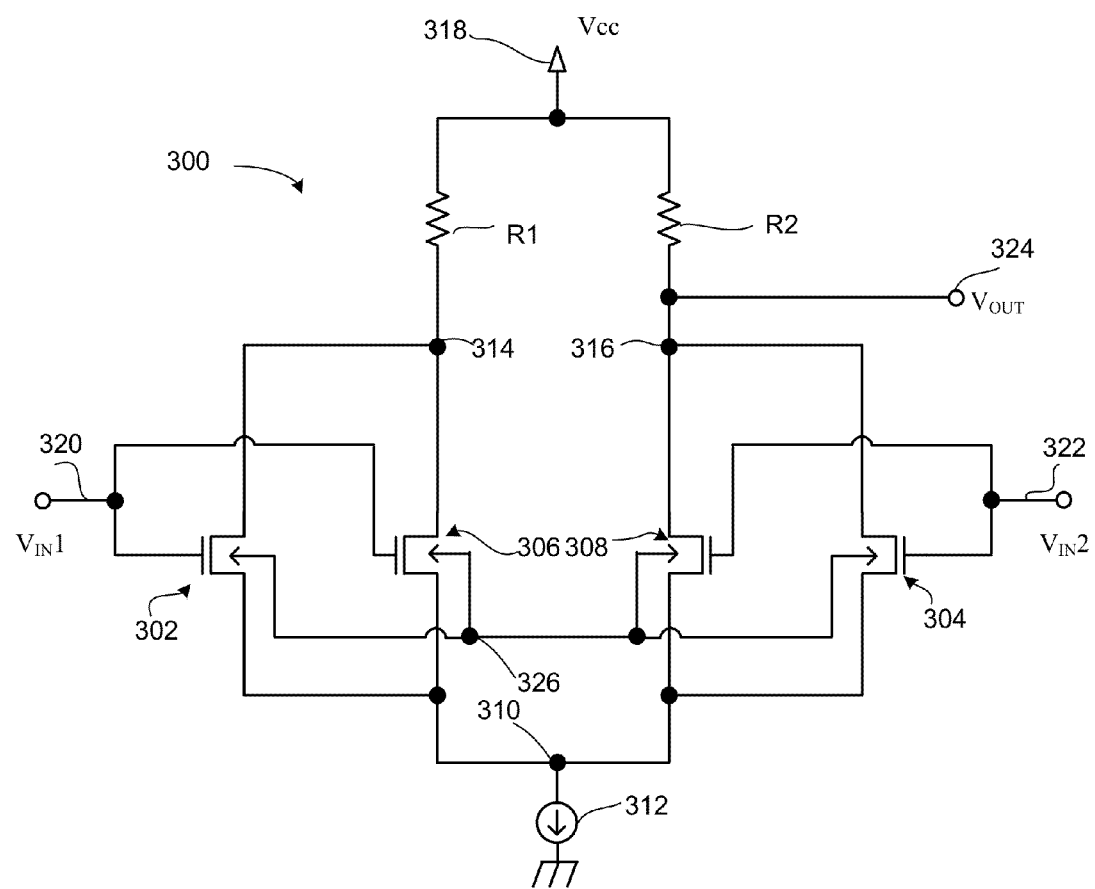
FIG. 22 illustrates a circuit diagram of a plural differential pair transistor circuit according to an embodiment.

FIG. 22 illustrates a plural differential pair transistor circuit 300 according to various embodiments. The semiconductor device 100 may be employed to implement the plural differential pair transistor circuit 300 as described below. The plural differential pair transistor circuit 300 includes a first differential pair of transistors 302, 304 and a second differential pair of transistors 306, 308. The first and second pair of transistors may be operated together or independently. It should be noted that differential pair of transistors means the transistors that make up a differential pair such as the transistors 302, 304 making the first differential pair of transistors and the transistors 306, 308 making the second differential pair of transistors. The term parallel pair of transistors means the pair of transistors that are in parallel with each other such as transistors 302, 306 making a first parallel pair and transistors 304, 308 making a second parallel pair. The source nodes of transistors 302, 304, 306, and 308 are coupled at a common node 310 with a current source 312. The current source 312 may be any suitable current source, such as a transistor current source. One terminal of the current source 312 may be coupled with a ground as shown. The drain nodes of transistors 302 and 306 are coupled at a common drain node 314 with a resistor R1. The drain nodes of transistors 304 and 308 are coupled at a common drain node 316 with a resistor R2. The resistors R1 and R2 may be coupled in parallel with a supply voltage (Vcc) 318. The resistors R1 and R2 may be any suitable resistive elements, such as resistors or transistors. All of the transistors 302, 304, 306, and 308 in the plural differential pair transistor circuit 300 have their body contacts coupled together at body node 326. It may be an advantage to have the body contacts of the transistors 302, 304, 306, and 308 coupled together so the bodies of the transistors have substantially equal voltages thereby giving the transistors substantially equal threshold voltages.

The threshold voltage may generally be defined as the gate voltage where an inversion layer forms at the interface between the insulating layer and the body of a transistor. If the gate voltage is below the threshold voltage, the transistor is turned off. If the gate voltage is above the threshold voltage, the transistor is turned on (e.g., in linear or saturation regions). The threshold voltage for a transistor generally varies with the voltage difference between the source node and the body. In addition, the threshold voltage varies with the thickness of the insulating layer between the gate and the body. Further, the threshold voltage varies with temperature. If the threshold voltage for each transistor in a differential pair is different, the current-voltage ("I-V") characteristics of the transistors may not match. It is important that the transistors in a differential pair have matched I-V characteristics. Coupling the body contacts of the transistors 302, 304, 306, and 308 causes the threshold voltages of the transistors to be substantially equal. In the absence of coupling the body contacts of the transistors 302, 304, 306, and 308 together, the body voltages of the transistors may not be equal under various conditions, leading to mismatched I-V characteristics, resulting in poor performance.

In the shown embodiment, first parallel pair of transistors 302, 306 and second parallel pair of transistors 304, 308 may operate together. The gate electrodes of transistors 302 and 306 may couple together to form an input Vin1 (320), and the gate electrodes of transistors 304 and 308 may couple together to form an input Vin2 (322) to the plural differential pair transistor circuit 300. In the shown embodiment, the common drain node 316 of transistors 304 and 308 may couple with an output Vout (324). In another embodiment, an output may be taken from the common drain node 314. In yet another embodiment, differential outputs may be taken from the common drain nodes 314, 316. By operating the first and second differential pair of transistors 302, 304, 306, 308 together, the plural differential pair transistor circuit 300 may behave as a single differential pair having gain and other properties that are the sum of the two pairs.

In an alternate embodiment, the gate nodes of transistors 302 and 306 are not coupled, and the gate nodes of transistors 304 and 308 are not coupled. In this embodiment, each gate is an independent input. In addition, the first parallel pair of transistors 302, 306 and the second parallel pair of transistors 304, 308 may each have independent outputs.

In one embodiment, three or more differential pairs of transistors may be provided by having two or more parallel fins, each fin having a semiconductor 100 according to the principles of the invention.

In one embodiment, the body node 326 may be coupled to the source 310.

Figure 23:
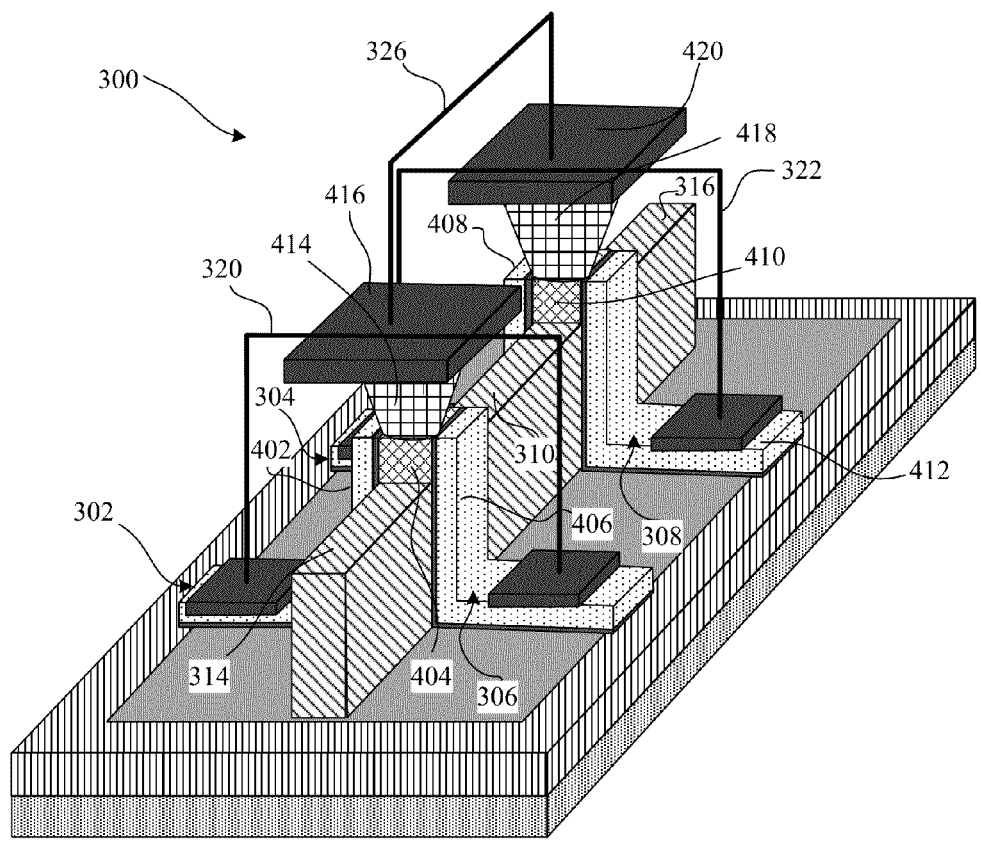
FIG. 23 is an isometric view of the plural differential pair transistor circuit of FIG. 22 using FinFET structures according to an embodiment.

FIG. 23 illustrates one embodiment of the plural differential pair transistor circuit 300 using FinFETs with body contacts, i.e., the semiconductor 100 described above. The plural differential pair 300 may be constructed using the structures and processes described herein for creating FinFETs with body contacts. FIG. 23 is an isometric view of the plural differential pair transistor circuit 300. The first differential pair of transistors 302 and 304 and second differential pair of transistors 306 and 308 are illustrated in FIG. 23. Transistor 302 is formed by a first gate electrode 402 on a first body area 404 having the first drain 314 and source 310. Transistor 306 is formed by a second gate electrode 406 that shares the first body area 404, first drain 314, and source 310 with transistor 302. As in FIG. 22, transistors 302 and 306 share the same source 310, same drain 314, and same gate input Vin1 (320) since the first gate electrode 402 and second gate electrode 406 are coupled together. Furthermore, since transistors 302 and 306 share first body area 404 in FIG. 23, their bodies are essentially coupled together as in FIG. 22.

The second parallel pair of transistors 304 and 308 are illustrated in FIG. 23. Transistor 304 is formed by a third gate electrode 408 on a second body area 410 having the second drain 316 and source 310. Transistor 308 is formed by a fourth gate electrode 412 that shares the second body area 410, second drain 316, and source 310 with transistor 304. As in FIG. 22, transistors 304 and 308 share the same source 310, same second drain 316, and same gate input Vin2 (322) since the third gate electrode 408 and fourth gate electrode 412 are coupled together. Furthermore, since transistors 304 and 308 share second body area 410 in FIG. 23, their bodies are essentially coupled together as in FIG. 22.

Also like FIG. 22, the bodies of all the transistors 302, 304, 306, and 308 are coupled together having a common body node 326. A first top fin area 414 may extend from the first body area 404. The first top fin area 414 may have a first body contact 416 coupled to the first top fin area 414. In addition, a second top fin area 418 may extend from the second body area 410. The second top fin area 418 may have a second body contact 420 coupled to it. Through an electrical connection of the first and second body contacts 416 and 420, the first and second body areas 404 and 410 may share the same body voltage. This results in transistors 302, 304, 306, and 308 having substantially the same body voltage or electrical connections.

In one embodiment, the first and second body contacts 416 and 420 may be one continuous body contact, contacting first and second top fin areas 414 and 418. In another embodiment, the first and second body areas 404 and 410 may be coupled to the source 310.

In yet another embodiment, an epitaxial growth may arise from the source 310 making a continuous top fin area extending from the first body area 404 to the second body area 410, thereby coupling first body 404, second body 410, and source 310.

In another embodiment, one or more fins may be grown in parallel with the existing fin to accommodate for three or more differential pairs of transistors in the plural differential pair transistor circuit 300.

In one embodiment, the transistors 302, 304, 306, and 308 may be NFET devices. In an alternative embodiment, the transistors 302, 304, 306, and 308 may be PFET devices.

Figure 24:
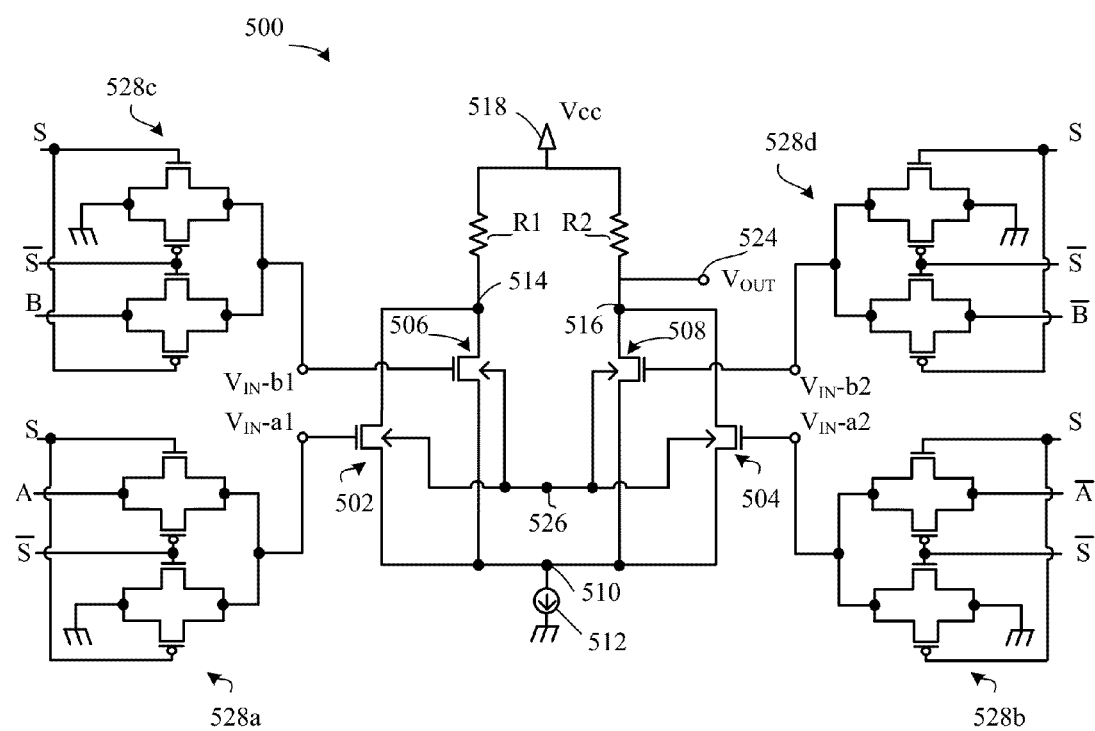
FIG. 24 illustrates a circuit diagram of another plural differential pair transistor circuit according to an embodiment.

FIG. 24 illustrates a plural differential pair transistor circuit 500, according to various embodiments. In the circuit 500, a first differential pair of transistors 502, 504 may operate independently of a second differential pair of transistors 506, 508. The circuit 500 includes two-input multiplexors 528a, 528b, 528c, and 528d that may facilitate the independent operation of the first and second differential pairs.

Like FIG. 22, the source nodes of transistors 502, 504, 506, and 508 are coupled at a common source node 510 with a current source 512. The current source 512 may be any suitable current source, such as a transistor current source. A terminal of the current source 512 may be coupled with a ground as shown. The drain nodes of transistors 502 and 506 are coupled at a common drain node 514. A resistor R1 couples common drain node 514 to supply voltage (Vcc) 518. The drain nodes of transistors 504 and 508 are coupled at a common drain node 516. A resistor R2 couples common drain node 516 to Vcc 518. The resistors R1 and R2 may be any suitable resistive elements, such as resistors or transistors. All of the transistors 502, 504, 506, and 508 in the plural differential pair transistor circuit 500 may have their body contacts coupled together at body node 526. It may be an advantage to have the body contacts of the transistors 502, 504, 506, and 508 coupled together so the bodies of the transistors have substantially equal voltages, thereby giving the transistors substantially equal threshold voltages.

In the shown embodiment, first and second differential pairs of transistors are capable of being operated independently. The gate electrodes of transistors 502, 504, 506, and 508 all have independent inputs. The gate electrode of transistor 502 is designated input $V_{IN}$-a1. The gate electrode of transistor 504 is designated input $V_{IN}$-a2. The gate electrode of transistor 506 is designated input $V_{IN}$-b1. The gate electrode of transistor 508 is designated input $V_{IN}$-b2. $V_{IN}$-a1 is coupled with the output of the multiplexor 528a. $V_{IN}$-a2 is coupled with the output of a multiplexor 528b. $V_{IN}$-b1 is coupled with the output of the multiplexor 528c. $V_{IN}$-b2 is coupled with the output of the multiplexor 528d.

In some implementations, it may be desirable to turn off the transistors of one differential pair while operating the other differential pair. For example, if the first differential pair of transistors 502, 504 are turned on, they may interfere with the operation of the second differential pair of transistors 506, 508. The interference may occur because the differential pairs share the common source node 510.

The two-input multiplexors 528a, 528b, 528c, and 528d may be employed to turn off the first differential pair of transistors 502, 504 while allowing the second differential pair of transistors 506, 508 to receive input signals. Each multiplexor may receive signals S or S. S may be the complement signal of S. Furthermore, multiplexor 528a has an input signal of A, which may be outputted by multiplexor 528a as $V_{IN}$-a1 if A is the selected signal. Multiplexor 528b has the complement of A as an input signal A, which may be output by multiplexor 528b as $V_{IN}$-a2 if A is the selected signal. Multiplexor 528c has an input signal B, which may be output by multiplexor 528c as $V_{IN}$-b1 if B is the selected signal. Multiplexor 528d has the complement of B as an input signal, B, which may be output by multiplexor 528d as $V_{IN}$-b1 if B is the selected signal.

In the shown embodiment, if S is asserted (and S is not asserted), the first differential pair of transistors 502, 504 are operable to receive input signals A and A, respectively. In addition, if S is asserted (and S is not asserted), the second differential pair of transistors 506, 508 are turned off. Assertion of the S select signal causes the inputs $V_{IN}$-b1 and $V_{IN}$-b2 to be coupled with ground.

In the shown embodiment, if S is not asserted (and S is asserted), the second differential pair of transistors 506, 508 are operable to receive input signals B and B, respectively. In addition, if S is not asserted (and S is asserted), the first differential pair of transistors 502, 504 are turned off. Assertion of the S select signal causes the inputs $V_{IN}$-a1 and $V_{IN}$-a2 to be coupled with ground.

While the invention has been described with reference to the specific embodiments thereof, those skilled in the art will be able to make various modifications to the described embodiments of the invention without departing from the true spirit and scope of the invention. The terms and descriptions used herein are set forth by way of illustration only and are not meant as limitations. Those skilled in the art will recognize that these and other variations are possible within the spirit and scope of the invention as defined in the following claims and their equivalents.

What is claimed is:

1. A method for making a plural differential pair comprising:
    forming a first semiconductor fin having first and second drain areas, first and second body areas disposed between the first and second drain areas, and a source area disposed between the first and second body areas, the fin having first and second sides that are substantially perpendicular to a substrate, and a top side between the first and second sides, the top side being substantially parallel to the substrate and located opposite a side of the fin in contact with the substrate;
    forming a first pair of fin field effect (FinFET) transistors, the first pair including a first FinFET having a first gate electrode adjacent to the first body area, and a second FinFET having a second gate electrode adjacent to the second body area;
    forming a second pair of FinFET transistors, the second pair including a third FinFET having a third gate electrode adjacent to the first body area, and a fourth FinFET having a fourth gate electrode adjacent to the second body area; and forming a first top fin area and a second top fin area projecting from respective portions of the top side of the first and second body areas of the fin, wherein the width of the first and second top fin areas increase from being the width of the respective first and second body areas at a base of the first and second top fin areas to being wider than the width of the first and second body areas at a top of the first and second top fin areas, wherein the forming the first top fin area and the second top fin area projecting from respective portions of the top side of the first and second body areas of the fin comprises:

etching the gate electrodes of the first pair of FinFET transistors and the second pair for FinFET transistors to a height that is less than the height of the respective first body area and second body area;

exposing the top of the first and second body areas;

epitaxially growing the first top fin area and the second top fin area from the tops of the respective first body area and second body area; and planarizing the first top fin area and the second top fin area so that the width of the first and second top fin areas increase from being the width of the respective first and second body areas at a base of the first and second top fin areas to being wider than the width of the first and second body areas at a top of the first and second top fin areas.

2. The method of claim 1, wherein the distance between the top side of the first body area of the fin and the substrate is greater than the distance between the top side of the first drain area of the fin and the substrate.

3. The method of claim 1, further comprising forming first and second body contacts respectively coupled with the first and second top fin areas.

4. The method of claim 1, further comprising coupling the first gate electrode with the third gate electrode, and coupling the second gate electrode with the fourth gate electrode.

5. The method of claim 1, further comprising:
coupling a first multiplexer with the first gate electrode;
coupling a second multiplexer with the second gate electrode;
coupling a third multiplexer with the third gate electrode; and
coupling a fourth multiplexer with the fourth gate electrode.

6. The method of claim 1, further comprising:
forming a second semiconductor fin having third and fourth drain areas, third and fourth body areas disposed between the third and fourth drain areas, and a source area disposed between the third and fourth body areas, the fin having first and second sides that are substantially perpendicular to the substrate, and a top side between the first and second sides and substantially parallel to the substrate;

forming a third pair of FinFET transistors, the third pair including a fifth FinFET having a fifth gate electrode adjacent to the third body area, and a sixth FinFET having a sixth gate electrode adjacent to the fourth body area; and forming a fourth pair of FinFET transistors, the fourth pair including a seventh FinFET having a seventh gate electrode adjacent to the third body area, and an eighth FinFET having an eighth gate electrode adjacent to the fourth body area.

* * * * *